(12) United States Patent
Kodama

(10) Patent No.: US 11,469,204 B2
(45) Date of Patent: Oct. 11, 2022

(54) SEMICONDUCTOR DEVICE

(71) Applicant: SUMITOMO ELECTRIC DEVICE INNOVATIONS, INC., Kanagawa (JP)

(72) Inventor: Akitada Kodama, Yokohama (JP)

(73) Assignee: SUMITOMO ELECTRIC DEVICE INNOVATIONS, INC., Kanagawa (JP)

( * ) Notice: Subject to any disclaimer, the term of this patent is extended or adjusted under 35 U.S.C. 154(b) by 0 days.

(21) Appl. No.: 17/149,104

(22) Filed: Jan. 14, 2021

(65) Prior Publication Data
US 2021/0217722 A1 Jul. 15, 2021

(30) Foreign Application Priority Data

Jan. 15, 2020 (JP) .............................. JP2020-004425

(51) Int. Cl.
*H01L 23/00* (2006.01)
*H01L 25/07* (2006.01)

(52) U.S. Cl.
CPC .............. *H01L 24/49* (2013.01); *H01L 24/05* (2013.01); *H01L 25/072* (2013.01); *H01L 2224/04042* (2013.01); *H01L 2224/4903* (2013.01); *H01L 2224/4912* (2013.01); *H01L 2224/4918* (2013.01); *H01L 2224/49113* (2013.01); *H01L 2224/49175* (2013.01); *H01L 2224/49177* (2013.01); *H01L 2924/30107* (2013.01)

(58) Field of Classification Search
CPC ....... H01L 24/49; H01L 24/05; H01L 25/072; H01L 224/04042; H01L 224/4903
See application file for complete search history.

(56) References Cited

U.S. PATENT DOCUMENTS

2018/0090456 A1* 3/2018 Kato ................. H01L 23/49844
2020/0118950 A1* 4/2020 Fukunaga ............... H01L 24/49

FOREIGN PATENT DOCUMENTS

JP 2011-239338 11/2011
JP 2012-146910 8/2012

* cited by examiner

*Primary Examiner* — Marc Anthony Armand
(74) *Attorney, Agent, or Firm* — Smith, Gambrell & Russell, LLP.

(57) ABSTRACT

A semiconductor device includes at least one transistor, a plurality of input wires, and a plurality of output wires. The at least one transistor has a plurality of input pads arranged along one side of the at least one transistor and a plurality of output pads arranged along another side of the at least one transistor facing the one side. The plurality of input wires are respectively connected to the plurality of input pads. The plurality of output wires are respectively connected to the plurality of output pads and have longer wire lengths than the plurality of input wires. Adjacent input wires of the plurality of input wires are arranged parallel to each other, and adjacent output wires of the plurality of output wires are arranged non-parallel to each other.

17 Claims, 20 Drawing Sheets

SEMICONDUCTOR DEVICE

CROSS-REFERENCE TO RELATED APPLICATIONS

The present application is based upon and claims the benefit of the priority from Japanese Patent Application No. 2020-004425, filed on Jan. 15, 2020, the entire contents of which are incorporated herein by reference.

TECHNICAL FIELD

The present disclosure relates to a semiconductor device.

BACKGROUND

JP2011-239338A discloses a high-frequency circuit. JP2012-146910A discloses a semiconductor device including a high-frequency semiconductor chip.

SUMMARY

The present disclosure provides a semiconductor device. The semiconductor device includes at least one transistor, a plurality of input wires, and a plurality of output wires. The at least one transistor has a plurality of input pads arranged along one side of the at least one transistor and a plurality of output pads arranged along another side of the at least one transistor facing the one side. The plurality of input wires are respectively connected to the plurality of input pads. The plurality of output wires are respectively connected to the plurality of output pads and have longer wire lengths than the plurality of input wires. Adjacent input wires of the plurality of input wires are arranged parallel to each other. Adjacent output wires of the plurality of output wires are arranged non-parallel to each other.

DETAILED DESCRIPTION

Figure 1:
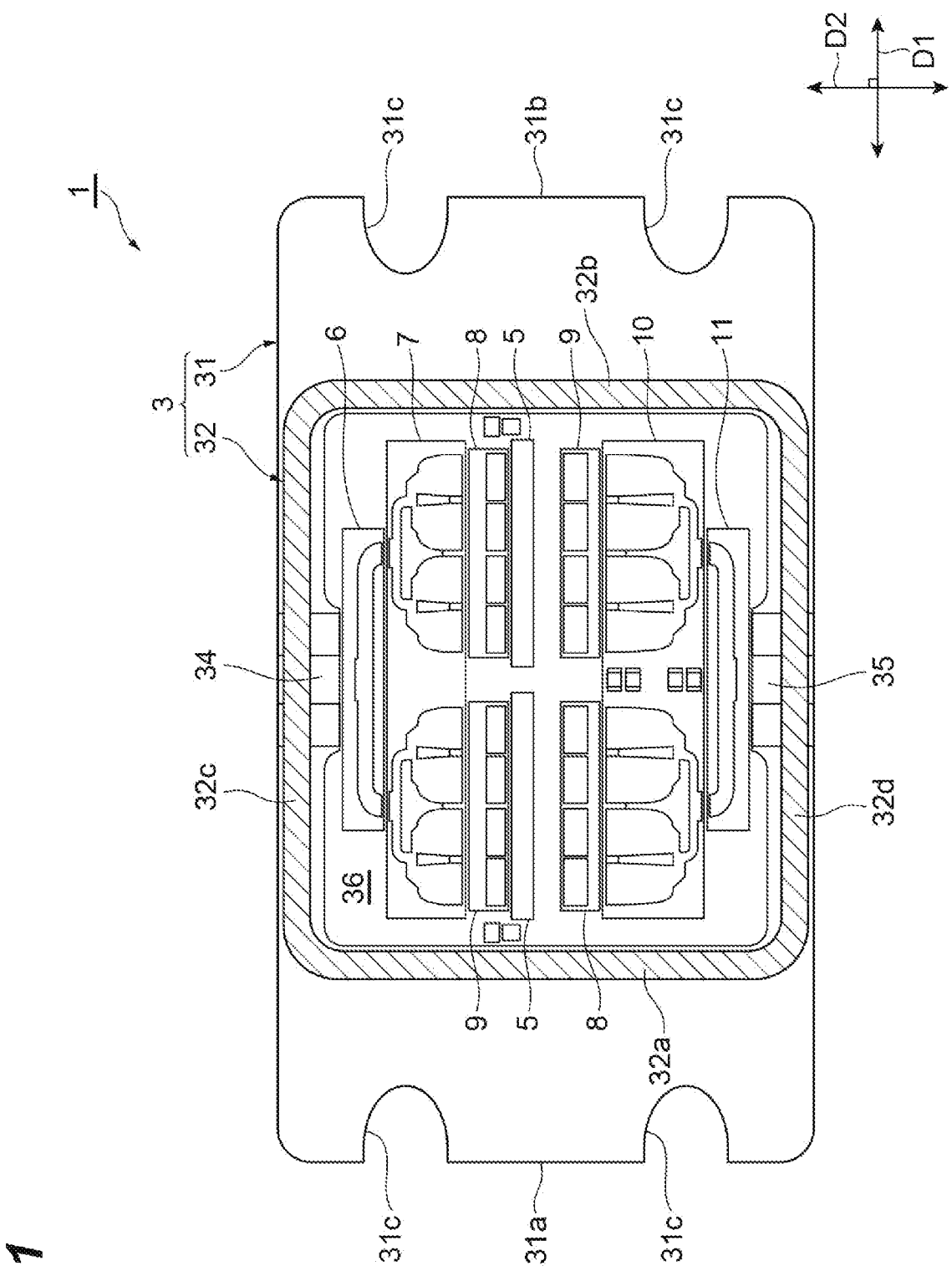
FIG. 1 is a plan view illustrating a configuration of a semiconductor device according to an embodiment.

Problem to be Solved by Present Disclosure

Semiconductor devices including a transistor and a matching circuit substrate are known. The transistor has a plurality of units each including a gate, a source and a drain. The matching circuit substrate is provided at least on an output side of the transistor. For example, such semiconductor devices are used as devices for amplifying a high-frequency signal. In such devices, a plurality of output pads (drain pads) of the transistor are electrically connected to the matching circuit substrate via wires (for example, bonding wires).

The plurality of output pads are arranged in a row along one side of the transistor, and a plurality of wires corresponding to the respective output pads are also arranged in a row along one side of the transistor. In such a configuration, a mutual inductance caused by currents flowing in other wires is generated in each wire. Particularly, when a plurality of wires are parallel to each other, a mutual inductance is noticeably generated. A magnitude of a mutual inductance varies depending on a position of each wire. Typically, mutual inductances generated in wires positioned at outermost ends in an array direction of wires is the smallest, and a mutual inductance generated in a wire positioned in the middle is the largest. Consequently, inductance variation occurs between the plurality of wires, and this causes a phase difference between a plurality of signals. Such a phase difference leads to deterioration in waveform of a composite signal of a plurality of signals.

Effects of Present Disclosure

According to the present disclosure, it is possible to provide a semiconductor device capable of reducing inductance variation between a plurality of wires.

Description of Embodiment of Present Disclosure

A semiconductor device according to an embodiment includes at least one transistor, a plurality of input wires, and a plurality of output wires. The at least one transistor has a plurality of input pads arranged along one side of the at least one transistor and a plurality of output pads arranged along another side of the at least one transistor facing the one side. The plurality of input wires are respectively connected to the plurality of input pads. The plurality of output wires are respectively connected to the plurality of output pads and have longer wire lengths than the plurality of input wires. The adjacent input wires of the plurality of input wires are arranged parallel to each other, and the adjacent output wires of the plurality of output wires are arranged non-parallel to each other.

In this semiconductor device, adjacent output wires are non-parallel to each other. A mutual inductance occurring in the output wires becomes the largest when adjacent output wires are parallel to each other and is reduced when adjacent output wires are non-parallel to each other. Therefore, according to the semiconductor device, a mutual inductance occurring in the output wires can be reduced, and inductance variation between the output wires can be reduced.

The semiconductor device may further include at least one output circuit substrate that has first metal patterns. Each of the first metal patterns may be connected to at least two of the plurality of output pads via the adjacent output wires. A gap between the adjacent output wires connecting one of the first metal patterns to the at least two output pads may be smaller on the first metal patterns side than on the output pads side. For example, due to such a configuration, adjacent output wires can be easily made non-parallel to each other.

In the semiconductor device, one ends of the adjacent output wires extending from at least two output pads of the plurality of output pads may be in contact with each other at a connection point connected to the one of the first metal patterns. For example, due to such a configuration, adjacent output wires can be easily made non-parallel to each other.

In the semiconductor device, an angle formed by the adjacent output wires extending from at least the two output pads may be 45° or more and 55° or less. According to simulation results, in this case, inductance variation between the output wires can be reduced more effectively.

The semiconductor device may further include at least one input circuit substrate that has second metal patterns. Each of the second metal patterns may be connected to at least two input pads of the plurality of input pads via the adjacent input wires. This makes it possible for the at least one input circuit substrate to perform impedance matching for the input signals input to the input pads of the at least one transistor.

The semiconductor device may further include at least one input circuit substrate, a base, a frame, an input terminal, and an output terminal. The at least one input circuit substrate may have second metal patterns. The base may have the at least one transistor, the at least one input circuit substrate, and the at least one output circuit substrate mounted thereon. The frame may be provided on the base and surround the at least one transistor, the at least one input circuit substrate, and the at least one output circuit substrate. The input terminal may be provided on the frame and be connected to the at least one input circuit substrate. The output terminal may be provided on the frame and be connected to the at least one output circuit substrate. Each of the second metal patterns may be connected to at least two input pads of the plurality of input pads via the adjacent input wires. Thus, the semiconductor device can constitute a radio frequency device.

In the semiconductor device, the at least one transistor may comprise a plurality of the transistors. The at least one input circuit substrate may comprise a plurality of the input circuit substrates. The at least one output circuit substrate may comprise a plurality of the output circuit substrates. Thus, a plurality of transistors can be provided, and the semiconductor device can constitute a high-output radio frequency device.

The semiconductor device may further include an input branching circuit substrate and an output coupling circuit substrate. The input branching circuit substrate may have a branching pattern whose one end is connected to the input terminal and the other end is connected to the plurality of input circuit substrates. The output coupling circuit substrate may have a coupling pattern whose one end is connected to the plurality of output circuit substrates and the other end is connected to the output terminal. The input branching circuit substrate can distribute the input signal to signals of the same level. The output coupling circuit substrate can couple signals and output a high output signal.

The semiconductor device may further include a base that has the at least one transistor and the at least one output circuit substrate mounted thereon. The at least one output circuit substrate may have a dielectric substrate. The first metal patterns may be provided on an upper surface of the dielectric substrate. A rear surface of the dielectric substrate may be connected to the base. The at least one output circuit substrate may have capacitance components between the first metal patterns and the base. Since the at least one output circuit substrate has the capacitance components, impedance matching for the output signals output from the output pads of the at least one transistor can be performed. By using the dielectric substrate for the at least one output circuit substrate, the at least one output circuit substrate can be miniaturized.

The semiconductor device may further include a base that has the at least one transistor and the at least one input circuit substrate mounted thereon. The at least one input circuit substrate may have a dielectric substrate. The second metal patterns may be provided on an upper surface of the dielectric substrate. A rear surface of the dielectric substrate may be connected to the base. The at least one input circuit substrate may have capacitance components between the second metal patterns and the base. Since the at least one input circuit substrate has capacitance components, impedance matching for the input signals input to the input pads of the at least one transistor can be performed. By using the dielectric substrate for the at least one input circuit substrate, the at least one input circuit substrate can be miniaturized.

In the semiconductor device, the input branching circuit substrate may have a dielectric substrate. The branching pattern may be provided on an upper surface of the dielectric substrate. A rear surface of the dielectric substrate may be connected to the base. The input branching circuit substrate may have a capacitance component between the branching pattern and the base. Since the input branching circuit substrate has a capacitance component, impedance matching for the input signals input to the input pads of the at least one transistor can be performed. By using the dielectric substrate for the input branching circuit substrate, the input branching circuit substrate can be miniaturized.

In the semiconductor device, the output coupling circuit substrate may have a dielectric substrate. The coupling pattern may be provided on an upper surface of the dielectric substrate. A rear surface of the dielectric substrate may be connected to the base. The output coupling circuit may have a capacitance component between the coupling pattern and the base. Since the output coupling circuit substrate has a capacitance component, impedance matching for the output signals output from the output pads of the at least one transistor can be performed. By using the dielectric substrate for the output coupling circuit substrate, the output coupling circuit substrate can be miniaturized.

In the semiconductor device, the plurality of output pads may be a plurality of drain pads.

In the semiconductor device, the plurality of input pads may be a plurality of gate pads.

In the semiconductor device, a semiconductor part of the transistor may be made of a gallium-nitride-based semiconductor.

Details of Embodiment of Present Invention

Specific examples of a semiconductor device according to an embodiment of the present disclosure will be described below with reference to the drawings. The present invention is not limited to the examples, but is indicated by the appended claims and is intended to include all modifications within the meaning and scope equivalent to the appended claims. In the following description, the same elements will be designated by the same reference numerals in the description of the drawings, and redundant description will be omitted.

Figure 2:
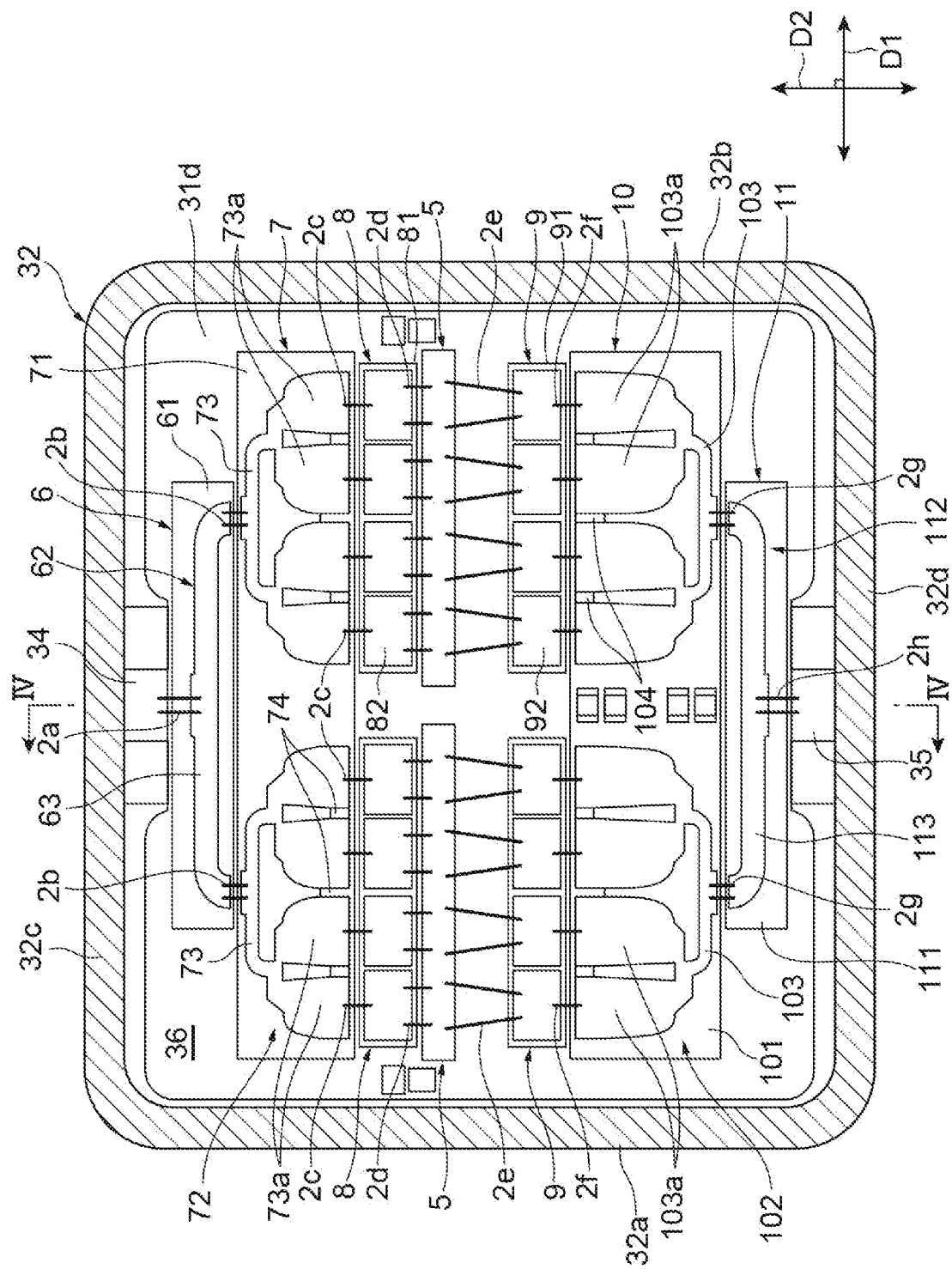
FIG. 2 is an enlarged plan view illustrating a main part of the semiconductor device.
Figure 3:
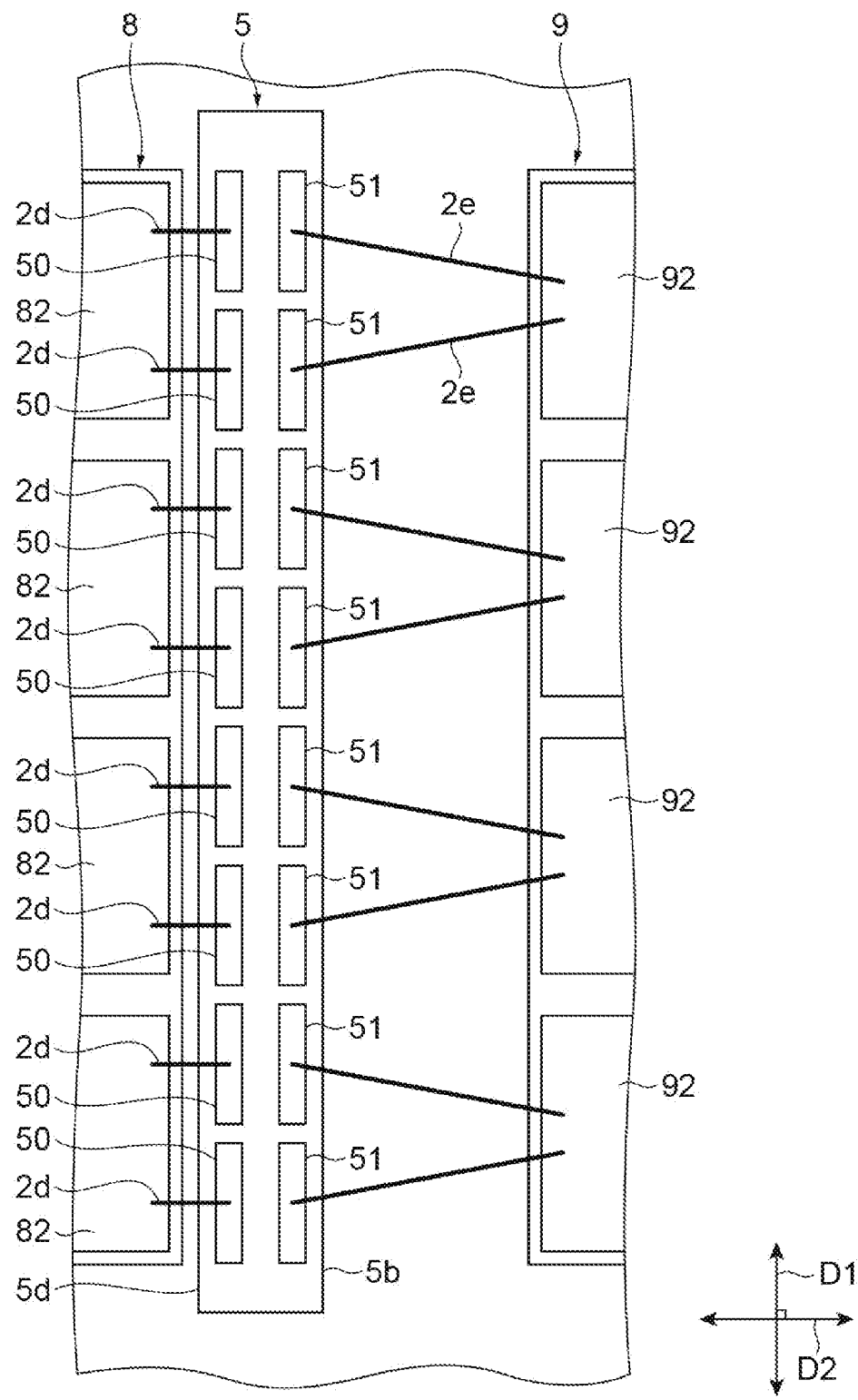
FIG. 3 is an enlarged view illustrating a transistor.
Figure 4:
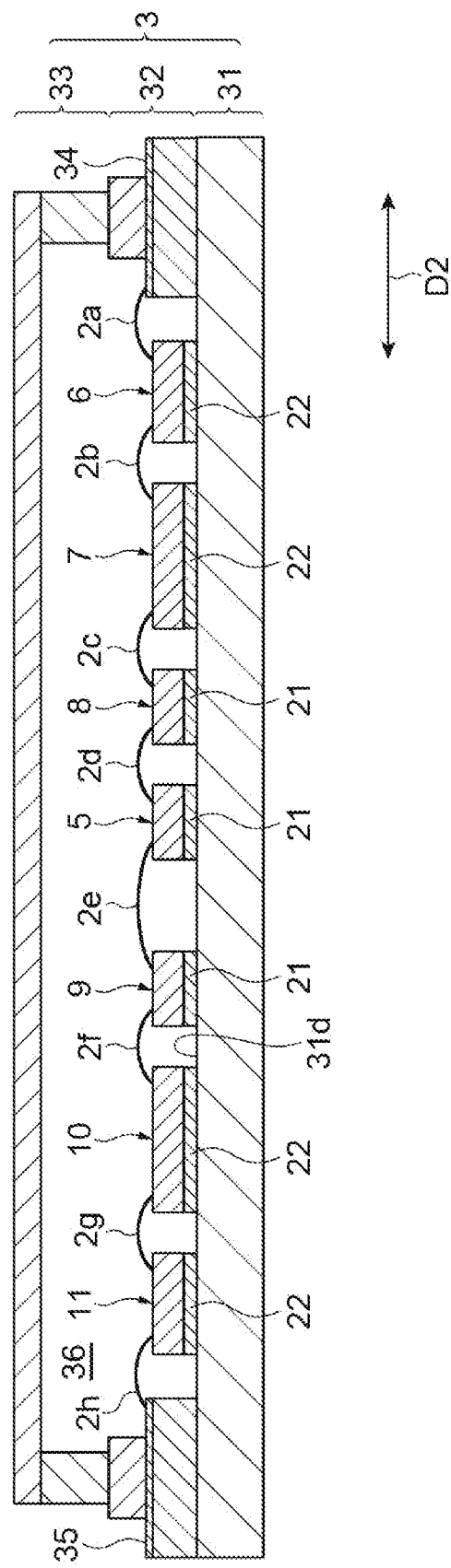
FIG. 4 is a cross-sectional view along line IV-IV indicated in FIG. 2.

FIG. 1 is a plan view illustrating a configuration of a semiconductor device 1 according to an embodiment. FIG. 2 is an enlarged plan view illustrating of a main part of the semiconductor device 1. FIG. 3 is an enlarged view illustrating one of transistors 5. FIG. 4 is a cross-sectional view along line IV-IV indicated in FIG. 2. In FIGS. 1 and 2, in order to facilitate understanding, illustration of a lid (cover) 33 of a package 3 is omitted. The semiconductor device 1 according to the present embodiment inputs a high-frequency signal and amplifies and outputs the high-frequency signal. As illustrated in FIGS. 1 to 4, the semiconductor device 1 includes the package 3, two transistors 5, input branching circuit substrates 6 and 7, two input circuit substrates 8, two output circuit substrates 9, and output coupling circuit substrates 10 and 11.

The package 3 has a metal base 31, an insulative frame 32 provided on the base 31, and the lid 33 (refer to FIG. 4). The transistors 5, the input branching circuit substrates 6 and 7, the input circuit substrates 8, the output circuit substrates 9, and the output coupling circuit substrates 10 and 11 are mounted on a surface 31d of the base 31. The base 31 is a plate-shaped member and has a planar shape such as substantially a rectangular shape having a direction D1 as a longitudinal direction. Two semicircular screw supports 31c for fixing the semiconductor device 1 through screwing are formed on each of a pair of end sides 31a and 31b facing each other in the direction D1. The base 31 is regulated to have a reference potential by being fixed to a conductive mount member regulated to have the reference potential through screwing.

The frame 32 has a closed planar shape such as substantially a rectangular frame shape. The frame 32 is constituted of a multi-layer ceramic material, for example. The frame 32 is fixed on the surface 31d of the base 31 with the normal direction of the surface 31d as the height direction. The frame 32 surrounds the transistors 5, the input branching circuit substrates 6 and 7, the input circuit substrates 8, the output circuit substrates 9, and the output coupling circuit substrates 10 and 11. The frame 32 defines a space 36 for accommodating the transistors 5 and the substrates 6 to 11 on the base 31. As illustrated in FIG. 4, an upper surface (a surface on a side opposite to the base 31) of the frame 32 is covered with the lid 33. Accordingly, the space 36 is air-tightly sealed. For example, the lid 33 is made of ceramic or metal. The frame 32 includes parts 32a and 32b facing each other in the direction D1 and parts 32c and 32d facing each other in a direction D2 intersecting (for example, orthogonal to) the direction D1. The parts 32a and 32b extend in the direction D2, and the parts 32c and 32d extend in the direction D1.

An input terminal 34 and an output terminal 35 are provided on the frame 32. The input terminal 34 and the output terminal 35 are constituted of metal films provided on layers of a ceramic material, and each of the terminals 34 and 35 extends in the direction D2. The part 32c of the frame 32 has a middle portion in the direction D1. The input terminal 34 penetrates the middle portion of the part 32c in the direction D2. A portion of the input terminal 34 is exposed to an outer side of the package 3. A lead wire (not illustrated) extending in the direction D2 is conductively joined to the portion of the input terminal 34 exposed to the outer side of the package 3. The input terminal 34 inputs a high-frequency signal from outside of the semiconductor device 1 via the lead wire. The high-frequency signal input to the input terminal 34 is a signal based on a multi-carrier transmission scheme. A high-frequency signal input to the input terminal 34 is formed by superimposing a plurality of signals of which frequencies of carrier signals are different from each other. Frequency bands of the carrier signals are 500 MHz or lower, for example. The part 32d of the frame 32 has a middle portion in the direction D1. The output terminal 35 penetrates the middle portion of the part 32d in the direction D2. A portion of the output terminal 35 is exposed to the outer side of the package 3. A different lead wire (not illustrated) extending in the direction D2 is conductively joined to the portion of the output terminal 35 exposed to the outer side of the package 3. The output terminal 35 outputs an amplified high-frequency signal to outside of the semiconductor device 1 via the different lead wire.

Each transistor 5 is conductively joined to the base 31 with a metal 21 including sintered Ag therebetween. Accordingly, transistors 5 are fixed to the base 31. The input circuit substrates 8 and the output circuit substrates 9 are adjacent to the transistors 5. Each of the input circuit substrates 8 and the output circuit substrates 9 is also conductively joined to the base 31 with the metal 21 including sintered Ag therebetween. Accordingly, the input circuit substrates 8 and the output circuit substrates 9 are fixed to the base 31. Each metal 21 is formed by heating a conductive paste for sintering containing Ag, evaporating a solvent of the conductive paste, and sintering the conductive paste. The input branching circuit substrates 6 and 7 and the output coupling circuit substrates 10 and 11, which are close to the frame 32, are conductively joined to the base 31 via AuSn eutectic solders 22. Accordingly, the input branching circuit substrates 6 and 7 and the output coupling circuit substrates 10 and 11 are fixed to the base 31.

With reference to FIG. 2, an internal configuration of the semiconductor device 1 of the present embodiment will be described in detail. As described above, the semiconductor device 1 includes two transistors 5. An output per transistor 5 is 30 W, for example, and the total output is 60 W, for example. Each transistor 5 internally has a plurality of units each including a gate, a source and a drain. These units are field effect transistors (FETs), for example. Each transistor 5 has a plurality of gate fingers, a plurality of source fingers, and a plurality of drain fingers. In the direction D1, the source fingers and the drain fingers are alternately arranged, and the gate fingers are disposed between the source fingers and the drain fingers. As illustrated in FIG. 3, each transistor 5 has one side 5d on the input terminal 34 side and the other side 5b on the output terminal 35 side facing the one side 5d. A plurality of gate pads (input pads) 50 and a plurality of source pads (not illustrated) are alternately arranged along the one side 5d on the one side 5d of each transistor 5 on the input terminal 34 side. A plurality of drain pads (output pads) 51 are arranged along the other side 5b on the other side 5b of each transistor 5 on the output terminal 35 side. Each source pad is electrically connected to the base 31 via a via hole penetrating the transistor 5 in the thickness direction and with the metal 21 therebetween (refer to FIG. 4), thereby having the reference potential or the ground potential. Each transistor 5 amplifies a high-frequency signal input to each gate pad 50 and outputs an amplified high-frequency signal from each drain pad 51.

For example, a semiconductor part of each transistor 5 is constituted of a GaAs-based compound semiconductor including a GaAs substrate or a gallium-nitride-based semiconductor. The lengths of the transistors 5 in the direction D1 are 1 mm, for example, and the lengths of the transistors 5 in the direction D2 are 6 mm, for example. The thicknesses of the transistors 5 are 0.1 mm, for example.

The input branching circuit substrates 6 and 7 are disposed side by side with the input terminal 34 and the transistors 5 in the direction D2 and are positioned between the input terminal 34 and the transistors 5. For example, the input branching circuit substrate 6 has a ceramic dielectric substrate 61 and a branch circuit 62 provided on an upper surface of the dielectric substrate 61. Similarly, for example, the input branching circuit substrate 7 has a ceramic dielectric substrate 71 and a branch circuit 72 provided on an upper surface of the dielectric substrate 71. As an example, the dielectric substrates 61 and 71 are made of $Al_2O_3$ (alumina). The dielectric substrates 61 and 71 have rectangular planar shapes, for example. One long side of each of the dielectric substrates 61 and 71 face the input terminal 34, and the other long side of each of the dielectric substrates 61 and 71 face the transistors 5 with the input circuit substrates 8 therebetween. The lengths of the long sides of the dielectric substrate 61 are 7.8 mm, for example. The lengths of the short sides of the dielectric substrate 61 are 2.0 mm, for example. The lengths of the long sides of the dielectric substrate 71 are 12.5 mm, for example. The lengths of the short sides of the dielectric substrate 71 are 3.8 mm, for example. The thicknesses of the dielectric substrates 61 and 71 are within a range of 0.3 mm to 0.5 mm, for example. A metal film (not illustrated) is fixed to a rear surface of each of the dielectric substrates 61 and 71, and the metal film is connected to the base 31 with the AuSn eutectic solder 22 therebetween. One short side of the dielectric substrate 71 is positioned in the vicinity of the part 32a of the frame 32. The other short side of the dielectric substrate 71 is positioned in the vicinity of the part 32b of the frame 32. That is, the dielectric substrate 71 extends from a part in the vicinity of one end of the frame 32 in the direction D1 to a part in the vicinity of the other end of the frame 32 in the direction D1.

The branch circuits 62 and 72 are branch circuits with respect to input circuits of the input circuit substrates 8. The branch circuit 62 includes a branching pattern 63 provided on the upper surface of the dielectric substrate 61. One end of the branching pattern 63 is electrically connected to the input terminal 34 via a wire 2a. The branching pattern 63 branches in two directions starting from a connection point with the wire 2a. The branch circuit 72 includes two branching patterns 73 provided on the upper surface of the dielectric substrate 71. Each of the branching patterns 73 is electrically connected to each of the two branched end portions of the branching pattern 63 via a wire 2b. Each of the branching patterns 73 repeatedly branches starting from a connection point with the wire 2b and ultimately reaches four metal pads 73a. Eight metal pads 73a in total are arranged side by side along the other long side of the dielectric substrate 71 on the transistors 5 side. The adjacent metal pads 73a are connected to each other with a film resistance 74 therebetween and constitute a Wilkinson coupler. This ensures the isolation between the plurality of gate pads 50 of the transistors 5 and matches the input impedance of the transistors 5 viewed from the input terminal 34. A resistance value of the film resistance 74 is 50Ω, for example.

Two input circuit substrates 8 are disposed between the input branching circuit substrate 7 and the transistors 5 in the direction D2 and are arranged in the direction D1. These input circuit substrates 8 include input circuits (input matching circuits) with respect to the transistors 5. Each input circuit substrate 8 has a dielectric substrate 81. Each input circuit substrate 8 is a dielectric capacitor, for example, and has one or a plurality (four in the present embodiment) of metal patterns 82 on an upper surface of the dielectric substrate 81. The total number of metal patterns 82 is the same number as that of the metal pads 73a, for example. The metal patterns 82 are arranged in a row in the direction D1. Each of the metal patterns 82 is electrically connected to the corresponding metal pad 73a via a wire 2c and is electrically connected to at least two corresponding gate pads 50 of the transistors 5 via at least two wires 2d (input wires). The number of wires 2d is two for one metal pattern 82, and the number of wires 2d is sixteen in total, for example. Adjacent wires 2d are disposed parallel to each other. The number of gate pads 50 connected to each metal pattern 82 is two, for example. A metal film (not illustrated) is fixed to a rear surface of each of the input circuit substrates 8, and the metal film is connected to the base 31 with the metal 21 therebetween.

Inductance components caused by the wires 2c and 2d are present in the input circuit substrates 8. The input circuit substrates 8 include nodes between the inductance components, that is, the metal patterns 82. A capacitance component is present between each node and a reference potential point, that is, the base 31. A T-type filter circuit is constituted of the inductance components caused by the wires 2c and 2d and the capacitance component. The input circuit substrates 8 perform impedance conversion using the T-type filter circuit. Normally, impedances allowed inside transistor units from the gate pads 50 in the transistor elements 5 differ from characteristic impedances of transmission lines (for example, 50Ω). The input circuit substrates 8 convert these impedances into 50Ω allowed inside the package 3 from the input terminal 34 through the T-type filter circuit.

The dielectric substrates 81 of the input circuit substrates 8 are made of AlN, for example. The lengths of the input circuit substrates 8 in the direction D1 are 5.4 mm, for example, and the lengths of the input circuit substrates 8 in the direction D2 are 2.0 mm, for example. The thicknesses of the input circuit substrates 8 are within a range of 0.2 mm to 0.3 mm, for example. The capacitances of the dielectric capacitors of the input circuit substrates 8 are 30 pF per one metal pattern 82, for example.

The two output circuit substrates 9 are disposed between the transistors 5 and the output coupling circuit substrates 10 and 11 in the direction D2 and are arranged in the direction D1. These output circuit substrates 9 include output matching circuits with respect to the transistors 5. Similar to the input circuit substrates 8, the output circuit substrates 9 are parallel flat plate-type capacitors (dielectric capacitors), for example. Each output circuit substrate 9 has a dielectric substrate 91. Each output circuit substrate 9 has one or a plurality (four in the present embodiment) of metal patterns 92 on an upper surface of the dielectric substrate 91. For example, the total number of metal patterns 92 is the same number as that of the metal patterns 82 of the input circuit substrates 8. A plurality of metal patterns 92 are arranged in a row in the direction D1. Each of the metal patterns 92 is electrically connected to at least two corresponding drain pads 51 of the transistors 5 via two or more wires 2e (output wires). Each of the metal patterns 92 is electrically connected to a corresponding metal pad 103a (which will be described below) of output coupling circuit substrates 10 via a wire 2f. The number of wires 2e is two for one metal pattern 92, for example. The number of wires 2e is sixteen in total, for example. A metal film (not illustrated) is fixed to a rear surface of each output circuit substrate 9, and the metal film is connected to the base 31 with the metal 21 therebetween.

Inductance components caused by the wires 2e and 2f are also present in the output circuit substrates 9. The output circuit substrates 9 include nodes between the inductance components, that is, the metal patterns 92. A capacitance component is present between each node and the reference potential point, that is, the base 31. A T-type filter circuit is constituted of the inductance components caused by the wires 2e and 2f and the capacitance component. The output circuit substrates 9 perform impedance conversion using the T-type filter circuit. Normally, impedances allowed inside the transistor units from the drain pads 51 in the transistors 5 differ from characteristic impedances of transmission lines (for example, 50Ω), and the value thereof is usually smaller than 50Ω. The output circuit substrates 9 convert these impedances into 50Ω allowed inside the package 3 from the output terminal 35 through the T-type filter circuit.

The dielectric substrates 91 of the output circuit substrates 9 are made of AlN, for example. The lengths of the output circuit substrates 9 in the direction D1 are 5.4 mm, for example. The lengths of the output circuit substrates 9 in the direction D2 are 2.0 mm, for example. The thicknesses of the output circuit substrates 9 are within a range of 0.2 mm to 0.3 mm, for example. The capacitances of the dielectric capacitors of the output circuit substrates 9 are 20 pF per one metal pattern 92, for example.

The output coupling circuit substrates 10 and 11 are disposed side by side with the transistors 5 and the output terminal 35 in the direction D2 and are positioned between the transistors 5 and the output terminal 35. For example, the output coupling circuit substrate 10 has a ceramic dielectric substrate 101 and a multiplexing circuit 102 provided on an upper surface of the dielectric substrate 101. Similarly, for example, the output coupling circuit substrate 11 has a ceramic dielectric substrate 111 and a multiplexing circuit 112 provided on an upper surface of the dielectric substrate 111. As an example, the dielectric substrates 101 and 111 are made of $Al_2O_3$ (alumina). The dielectric substrates 101 and 111 have rectangular planar shapes, for example. One long side of each of the output coupling circuit substrates 10 and 11 faces the transistors 5 with the output circuit substrates 9 therebetween, and the other long side of each of the output coupling circuit substrates 10 and 11 faces the output terminal 35. The lengths of the long sides of the dielectric substrate 101 are 12.5 mm, for example, and the lengths of the short sides of the dielectric substrate 101 are 4.5 mm, for example. The lengths of the long sides of the dielectric substrate 111 are 7.8 mm, for example, and the lengths of the short sides of the dielectric substrate 111 is 2.0 mm, for example. The thicknesses of the dielectric substrates 101 and 111 are within a range of 0.3 mm to 0.5 mm, for example. A metal film (not illustrated) is fixed to a rear surface of each of the dielectric substrates 101 and 111. The metal film is connected to the base 31 with the AuSn eutectic solder 22 therebetween. One short side of the dielectric substrate 101 is positioned in the vicinity of the part 32a of the frame 32. The other short side of the dielectric substrate 101 is positioned in the vicinity of the part 32b of the frame 32. That is, the dielectric substrate 101 extends from a part in the vicinity of one end of the frame 32 in the direction D1 to a part in the vicinity of the other end of the frame 32 in the direction D1.

The multiplexing circuits 102 and 112 are multiplexing circuits with respect to output circuits of the output circuit substrates 9. That is, the multiplexing circuits 102 and 112 multiplex signals output from the drain pads 51 of the transistors 5 and make the signals into one output signal. The multiplexing circuit 102 includes two coupling patterns 103 provided on an upper surface of the dielectric substrate 101. One end of each of the coupling patterns 103 includes four metal pads 103a. Four metal pads 103a are arranged side by side along the one long side of the output coupling circuit substrate 10 on the transistors 5 side. The adjacent metal pads 103a are connected to each other with a film resistance 104 therebetween and constitute a Wilkinson coupler. This ensures the isolation between the plurality of drain pads 51 of the transistors 5 and matches the output impedance of the transistors 5 viewed from the output terminal 35. A resistance value of the film resistance 104 is 50Ω, for example. Each of the metal pads 103a is electrically connected to the corresponding metal pattern 92 of the output circuit substrates 9 via the wire 2f.

Each of the coupling patterns 103 is repeatedly coupled from four metal pads 103a and ultimately reaches a connection point with a wire 2g. The coupling patterns 103 are electrically connected to two end portions included in a coupling pattern 113 of the multiplexing circuit 112 via the wire 2g. A middle portion of the coupling pattern 113 is positioned at the other end of the coupling pattern 113 in the direction D2 and is electrically connected to the output terminal 35 via a wire 2h.

Figure 5:
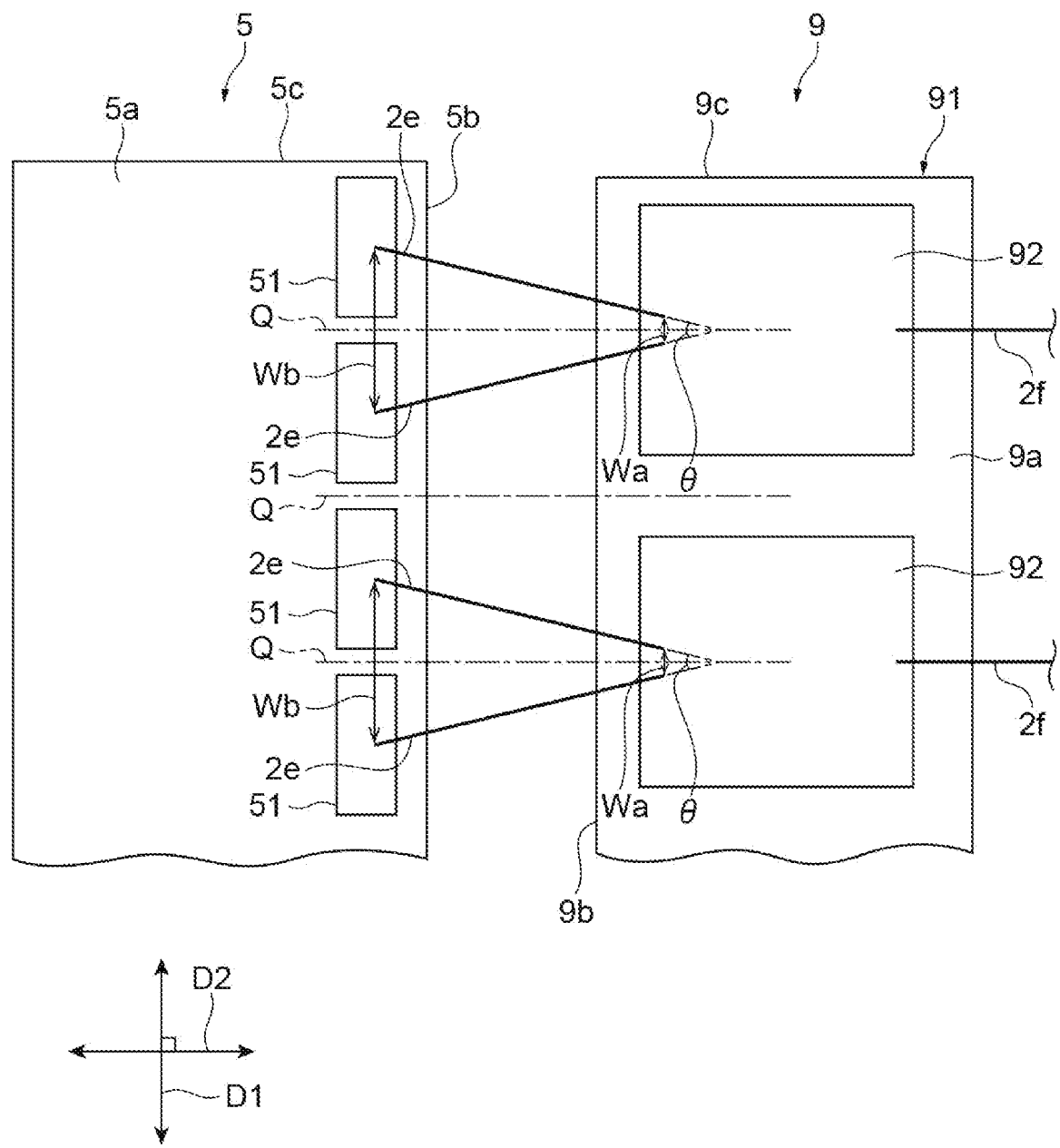
FIG. 5 is an enlarged plan view illustrating a part of each of an output circuit substrate and the transistor.

A connection form of each output circuit substrate 9 and each transistor 5 will be described in detail. FIG. 5 is an enlarged plan view illustrating a part of each of the output circuit substrates 9 and the transistors 5. As illustrated in FIG. 5, each transistor 5 has an upper surface 5a, a long side 5b extending in the direction D1 on the upper surface 5a, and a short side 5c extending in the direction D2 intersecting the direction D1. The upper surface 5a is a surface on a side opposite to the rear surface facing the base 31. The long side 5b is an end side of the transistor 5 on the output terminal 35 side. As described above, each transistor 5 has N drain pads 51 arranged along the long side 5b on the upper surface 5a. N is an integer equal to or larger than 3. As an example, each transistor 5 has eight drain pads 51.

Each of the output circuit substrates 9 is provided with a gap from the long side 5b of each transistor 5 in the direction D2. Each output circuit substrate 9 has an upper surface 9a extending in the direction D1. Each output circuit substrate 9 has a long side 9b extending in the direction D1 and a short side 9c extending in the direction D2. The long side 9b faces the long side 5b of the transistor 5 in the direction D2. The output circuit substrate 9 has one or a plurality (four in the present embodiment) of metal patterns 92 on the upper surface 9a described above. These metal patterns 92 are arranged side by side along the long side 9b.

For example, each drain pad 51 is electrically connected to at least one of the metal patterns 92 via one of the wires 2e mainly including gold (Au). In the illustrated example, one wire 2e is connected to one drain pad 51, and the number of wires 2e is N. The number of wires 2e is not limited to this example, and at least two wires 2e may be connected to one drain pad 51. In addition, at least two drain pads 51 are connected to one metal pattern 92 via the wires 2e. In the illustrated example, two drain pads 51 are connected to one metal pattern 92 via the wires 2e. The number thereof is not limited to this example, and at least three drain pads 51 may be connected to one metal pattern 92 via the wires 2e. These wires 2e have lengths equivalent to each other and are longer than the wires 2d.

As illustrated in FIG. 5, when viewed in the normal direction of each of the upper surfaces 5a and 9a, adjacent wires 2e are non-parallel to each other. Here, non-parallel indicates that two extending directions of the wires 2e form an angle therebetween greater than 0°. One extending direction is a direction when the wire 2e connected to one drain pad 51 is projected in a D1-D2 plane. The other extending direction is a direction when the wire 2e connected to another drain pad 51 adjacent to the one drain pad 51 is projected in the D1-D2 plane. In more practical manner, it indicates that these extending directions form a relative angle exceeding a manufacturing error (for example, ±5°).

As an example, the shapes of the wires 2e connected to adjacent drain pads 51 viewed in the normal direction of the upper surfaces 5a and 9a (in other words, the shapes projected in the D1-D2 plane) is line-symmetrical with an axis Q perpendicular to both the direction D1 and the normal direction of the upper surfaces 5a and 9a. That is, the axis Q is along the direction D2. In addition, on each metal pattern 92, one ends of the wires 2e extending from two drain pads 51 are separated from each other with a gap Wa therebetween. The gap between these adjacent wires is smaller on the metal pattern 92 side than on the drain pad 51 side. That is, the gap Wa between one ends on the metal pattern 92 is smaller than a gap Wb between the other ends of the wires 2e on the drain pads 51. As an example, the size of the gap Wa is within a range of 100 μm to 150 μm, and the size of the gap Wb is within a range of 600 μm to 1,200 μm. When viewed in the normal direction of the upper surfaces 5a and 9a, an angle θ formed by the wires 2e extending from two drain pads 51 is 20° or more and 145° or less, for example, and is more preferably 45° or more and 55° or less.

On each metal pattern 92, one ends of the wires 2e extending from two drain pads 51 are positioned in the middle portion of the metal pattern 92 in the direction D1. More specifically, a middle point between one ends of the wires 2e extending from two drain pads 51 is positioned on a center line of the metal pattern 92 in the direction D2. One end of the wire 2f connected to each of the metal patterns 92 is also positioned in the middle portion of the metal pattern 92 in the direction D1 (more specifically, on the center line of the metal pattern 92 in the direction D2).

Figure 6:
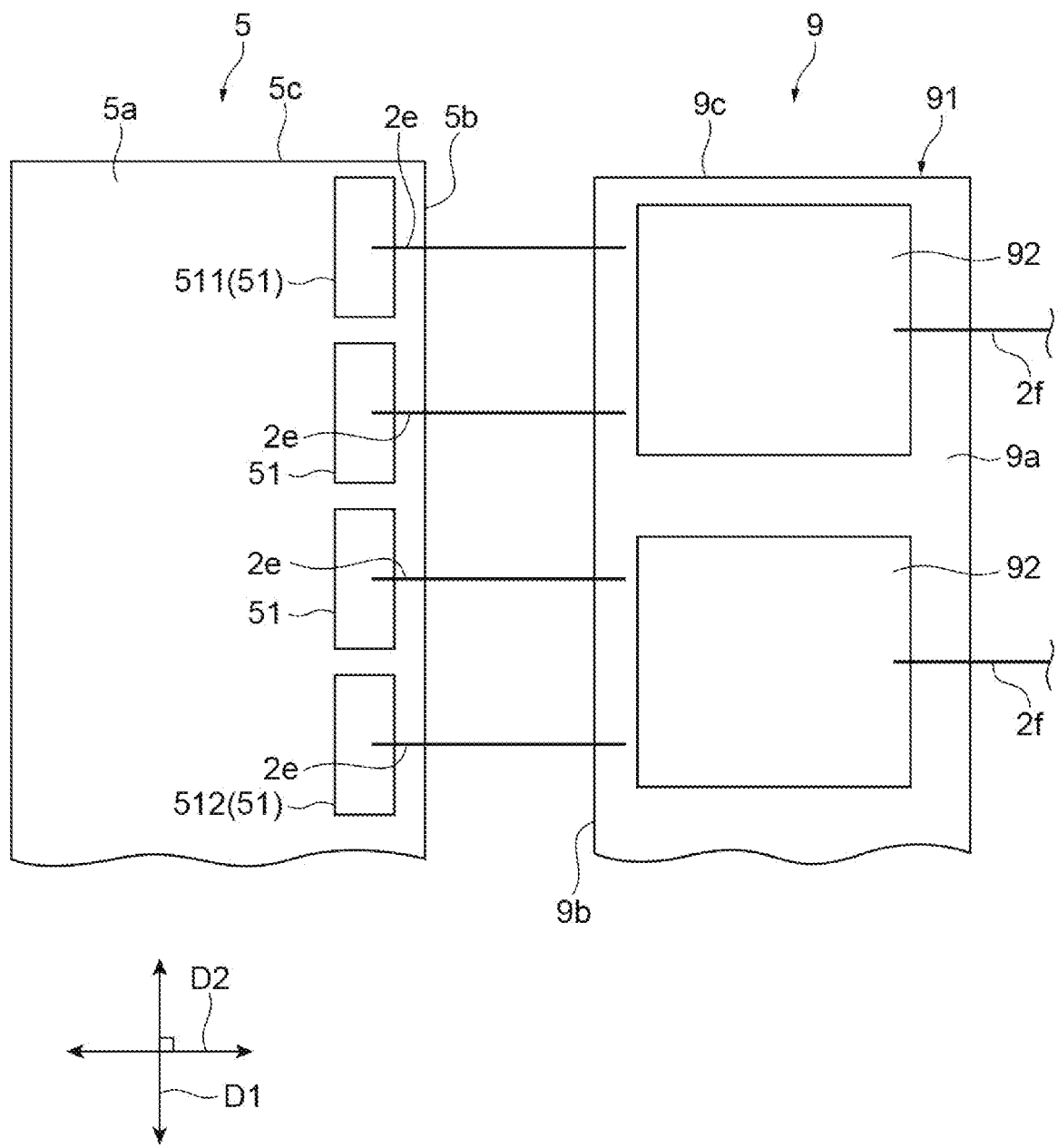
FIG. 6 is a plan view illustrating a case in which a plurality of output wires are parallel to each other in a comparative example.

Effects obtained by the semiconductor device 1 of the present embodiment described above will be described with a comparative example. FIG. 6 is a plan view illustrating a case in which adjacent wires 2e are parallel to each other in a comparative example. It is conceivable that the lengths of adjacent wires 2e are equivalent to each other. In this case, when an RF signal flows in the wires 2e from the transistor 5, variation occurs in inductance values of wires 2e due to a mutual inductance. Specifically, the inductance values of the wires 2e connected to drain pads 511 positioned at the outermost ends in an arrangement direction (direction D1) of the drain pads 51 become the smallest, and the inductance value of the wire 2e connected to a drain pad 512 positioned in the middle becomes the largest. That is, the largest range of variation in the inductance value is a difference between one of the inductance values of the wires 2e connected to the drain pads 511 and the inductance value of the wire 2e connected to the drain pad 512.

Figure 7:
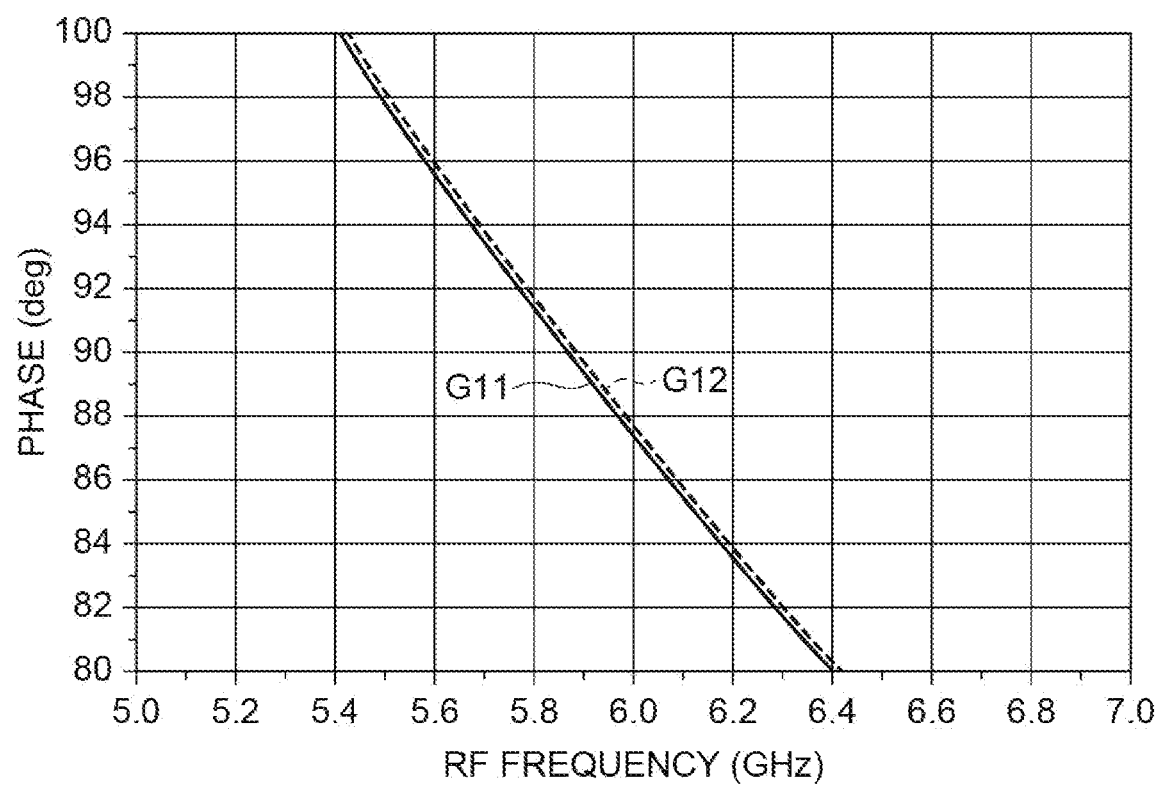
FIG. 7 is a graph illustrating a simulation result of a relationship between a signal frequency and a phase when the transistor has two output pads.
Figure 8:
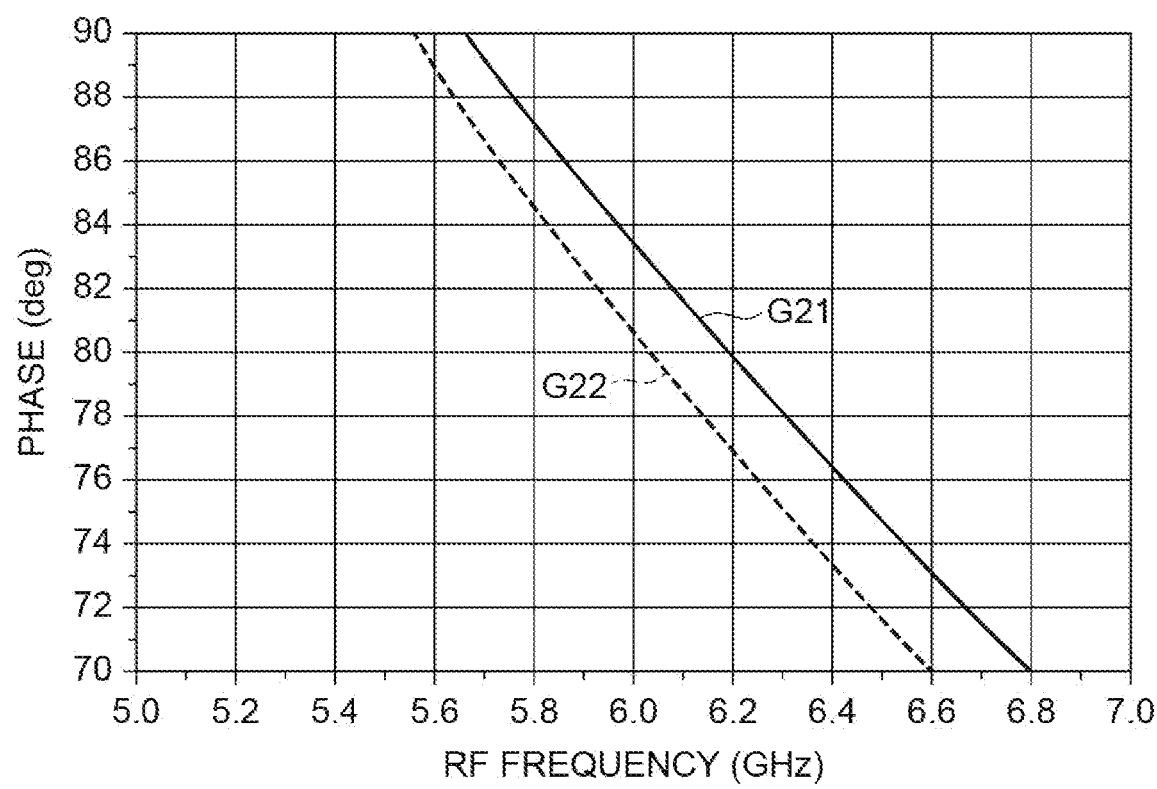
FIG. 8 is a graph illustrating a simulation result of a relationship between a signal frequency and a phase when the transistor has four output pads.

FIG. 7 is a graph illustrating simulation results of a relationship between a signal frequency (unit: GHz) and a phase (unit: degree) when each transistor 5 has two drain pads 51. In FIG. 7, the solid line G11 indicates a relationship therebetween in the wire 2e connected to one of the two drain pads 51. The dotted line G12 indicates a relationship therebetween in the wire 2e connected to the other of the two drain pads 51. FIG. 8 is a graph illustrating simulation results of a relationship between a signal frequency (unit: GHz) and a phase (unit: degree) when each transistor 5 has four drain pads 51. In FIG. 8, the solid line G21 indicates a relationship therebetween in the wire 2e connected to one of two drain pads 51, of four drain pads 51, positioned on the outer side. The dotted line G22 indicates a relationship therebetween in the wire 2e connected to one of two drain pads 51, of four drain pads 51, positioned on the inner side. As illustrated in FIG. 7, when the number of drain pads 51 is two, there is almost no phase difference between signals propagated in the wires 2e. In contrast, as illustrated in FIG. 8, when the number of drain pads 51 is four, a meaningful phase difference has occurred between a signal propagated in the wire 2e connected to the drain pad 51 on the outer side and a signal propagated in the wire 2e connected to the drain pad 51 on the inner side. This denotes that the inductance values of the wires 2e vary when the number of drain pads 51 is four. Such a variation in inductance values occurs when the number of drain pads 51 is three or greater.

Figure 9:
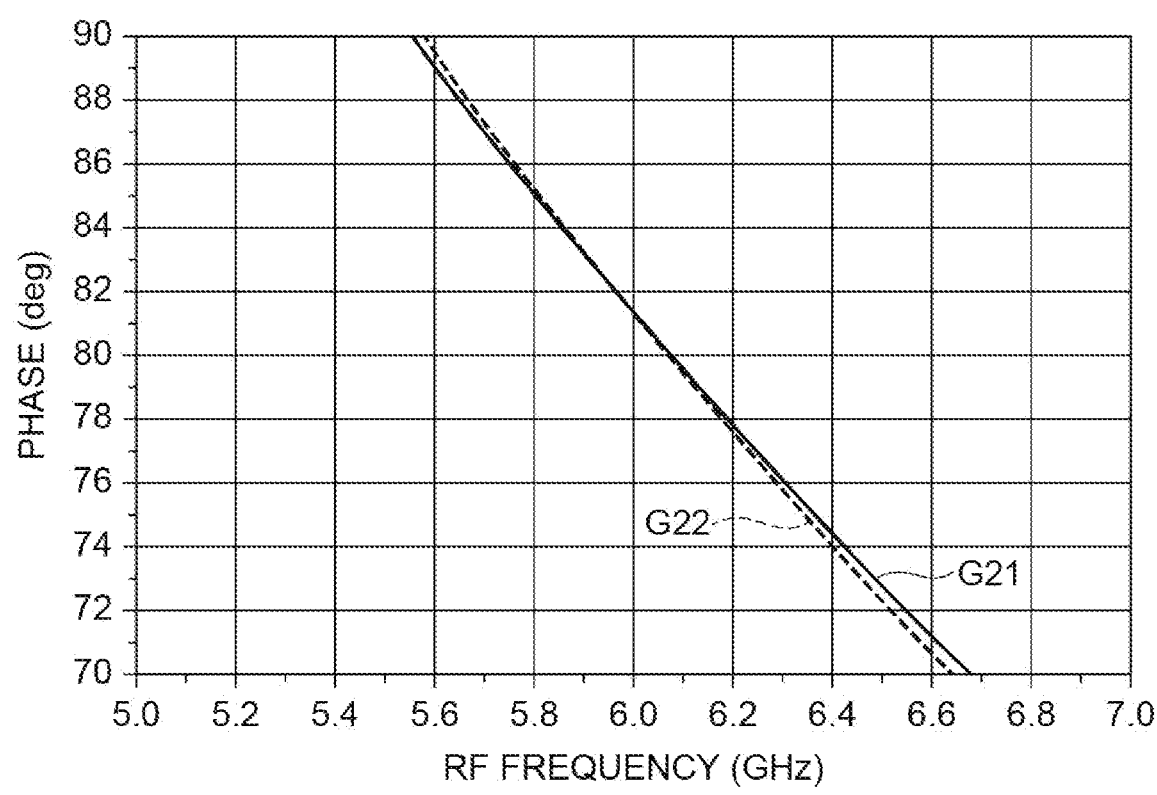
FIG. 9 is a graph illustrating a result when an inductor (0.08 nH) is added in series to each output wire connected to two output pads positioned on outer sides in the simulation when the transistor has four output pads.

FIG. 9 is a graph illustrating results when an inductor (0.08 nH) is added in series to each wire 2e connected to each drain pad 51 positioned on the outer side in the foregoing simulation when the number of drain pads 51 is four. In this case, the solid line G21 comes close to the dotted line G22, and the phase difference becomes almost eliminated. From this, in the foregoing simulation, when the number of drain pads 51 is four, it can be seen that the difference between the inductance value of the wire 2e connected to the drain pad 51 positioned on the outer side and the inductance value of the wire 2e connected to the drain pad 51 positioned on the inner side is 0.08 nH.

Figure 10:
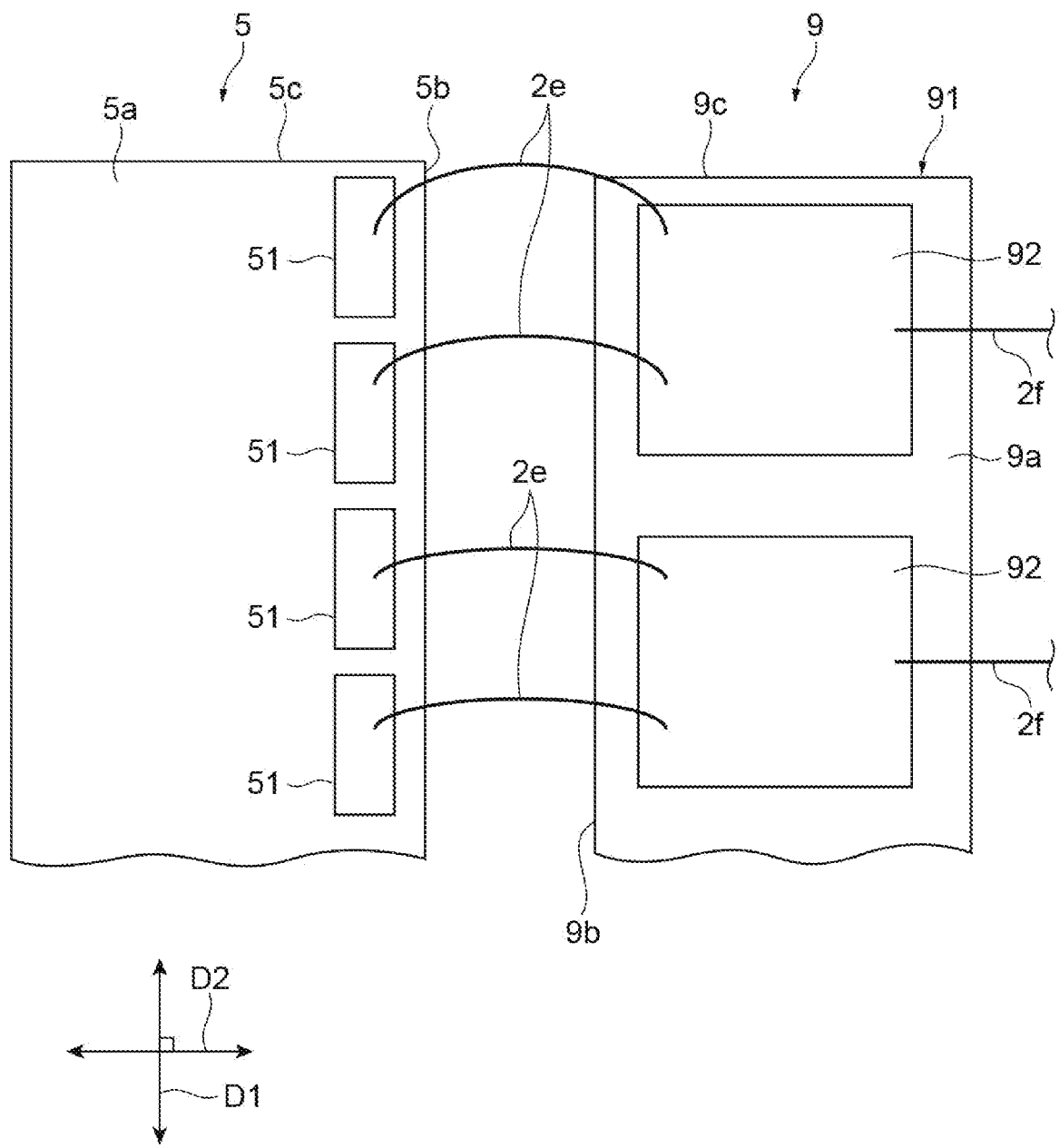
FIG. 10 is a view illustrating a form in which lengths of output wires connected to a plurality of output pads are varied with respect to each other.
Figure 11:
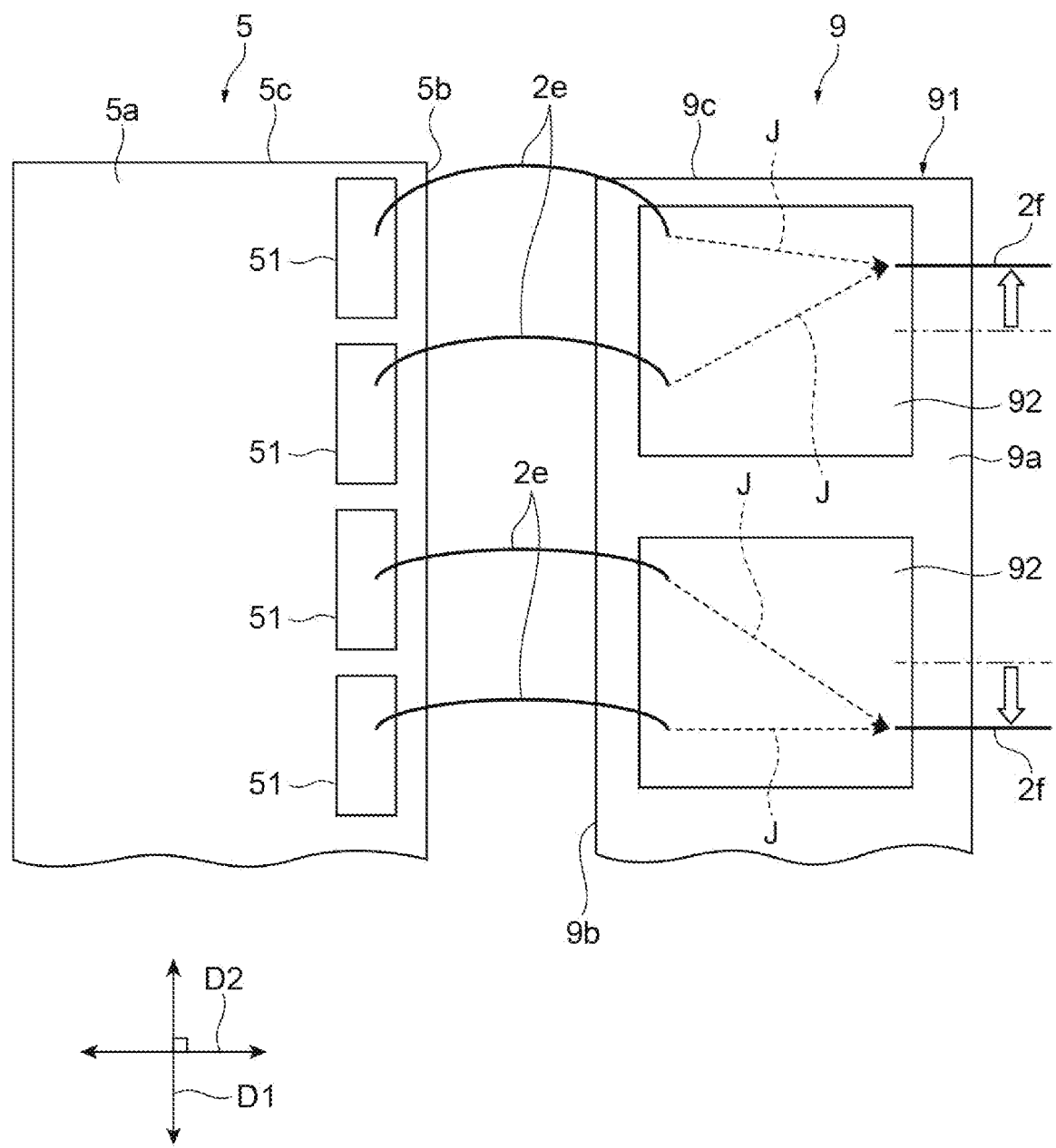
FIG. 11 is a view illustrating a case in which a connection position between a wire and a metal pattern deviates from a center of the metal pattern in a direction D1 in the form in which the lengths of output wires connected to a plurality of output pads are varied with respect to each other.
Figure 12:
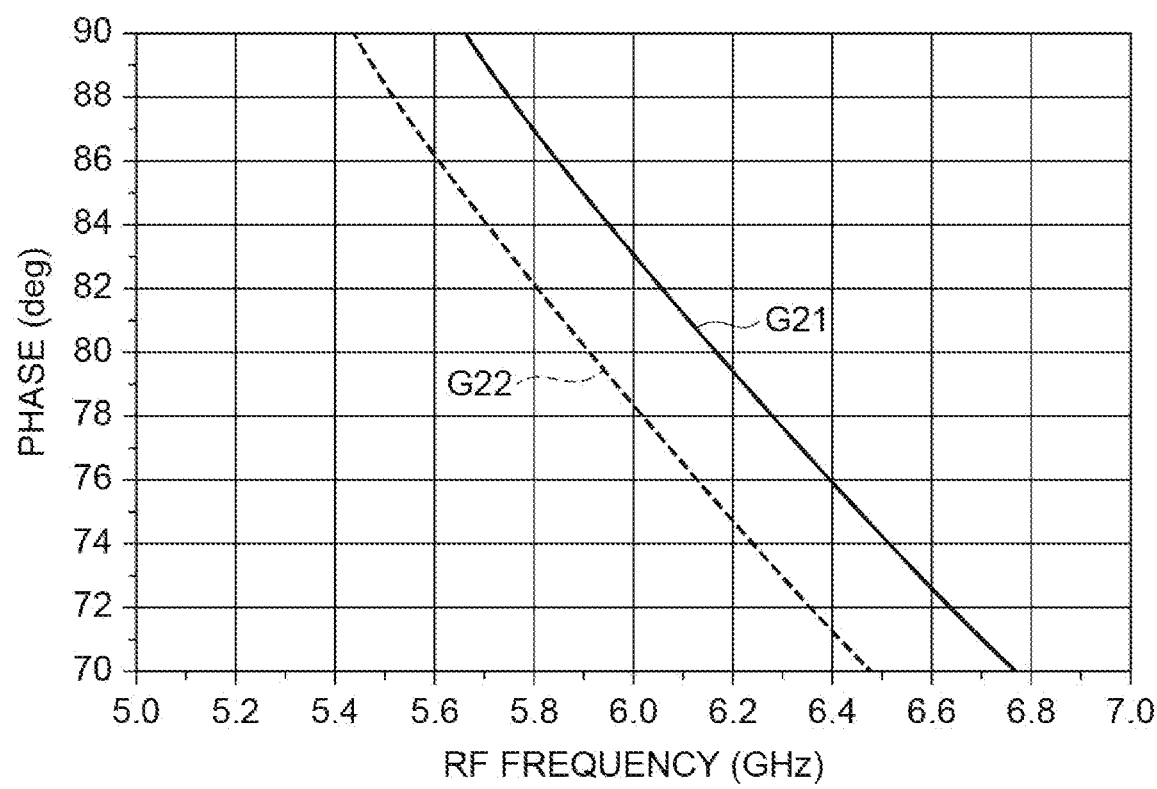
FIG. 12 is a graph illustrating a signal phase when the connection position between the wire and the metal pattern deviates from the center of the metal pattern in the simulation when the transistor has four output pads.

Regarding a method of eliminating such variation in inductance value, as illustrated in FIG. 10, it is conceivable that the lengths of the wires 2e are varied with respect to each other. That is, as it comes closer to the end of the row of the drain pads 51, the inductance is increased by lengthening the wire 2e connected to the drain pad 51. However, since each wire 2e constitutes a part of the circuit element, there is a need to adjust the length in order to optimize the high-frequency characteristics. For this reason, setting of the length of each wire 2e becomes extremely complicated, and thus manufacturing easiness is impaired. Furthermore, as illustrated in FIG. 11, a connection position between the wire 2f and the metal pattern 92 may deviate from a center of the metal pattern 92 in the direction D1 due to a manufacturing error or the like. In this case, a difference occurs in the length of a current path J inside the metal pattern 92, the phases of signals from two drain pads 51 connected to each metal pattern 92 deviate from each other. FIG. 12 is a graph illustrating a signal phase when the connection position between the wire 2f and the metal pattern 92 deviates from the center of the metal pattern 92 in the foregoing simulation when the number of drain pads 51 is four. As illustrated in FIG. 12, due to the positional deviation of the wire 2f, a significant phase difference occurs between the signal phase on a side where the current path J is shortened (solid line G21) and the signal phase on a side where the current path J is lengthened (dotted line G22).

In regard to the foregoing problems, in the semiconductor device 1 of the present embodiment, the wires 2e connected to the adjacent drain pads 51 are non-parallel to each other. A mutual inductance occurring in the wires 2e becomes the largest when the wires 2e are parallel to each other and is reduced when the wires 2e are non-parallel to each other. Therefore, according to the semiconductor device 1 of the present embodiment, a mutual inductance occurring in the wires 2e can be reduced, and inductance variation between the wires 2e can be reduced.

Figure 13:
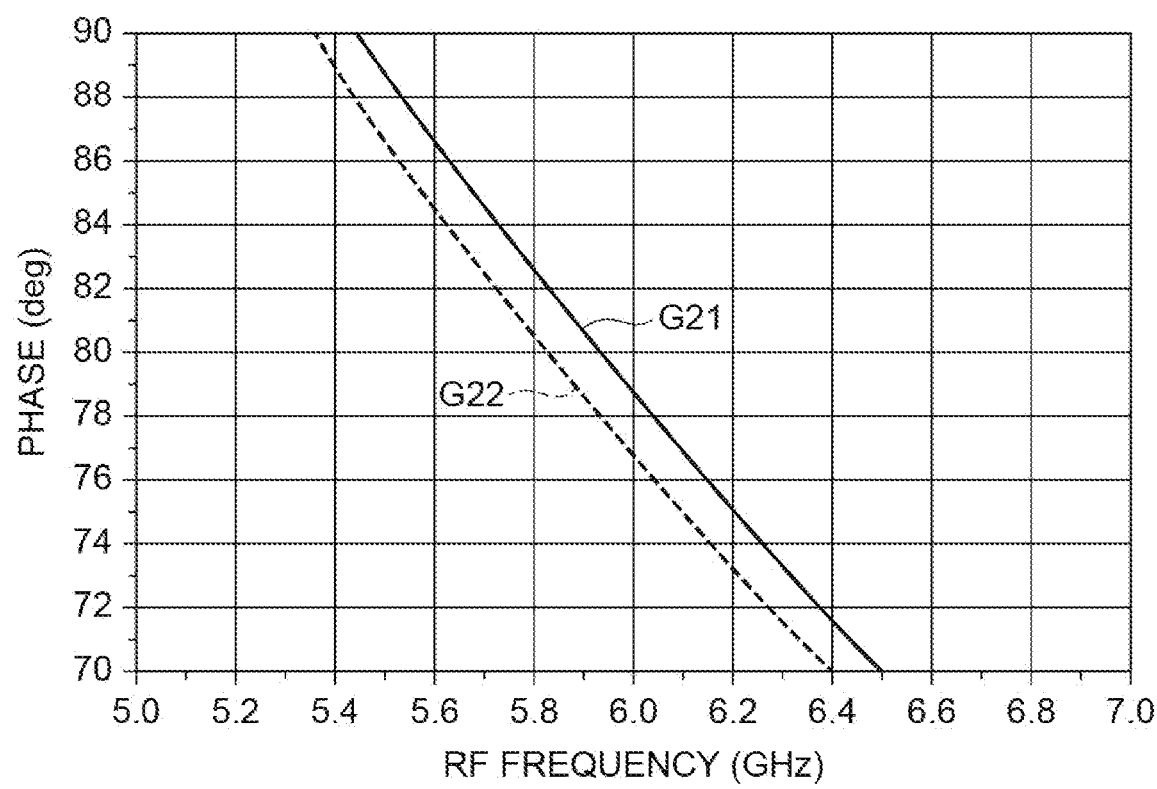
FIG. 13 is a graph illustrating a relationship between a signal frequency and a phase when the form of the output wires is set as the form illustrated in FIG. 5 in the simulation when the transistor has four output pads.

FIG. 13 is a graph illustrating a relationship between a signal frequency (unit: GHz) and a phase (unit: degree) when the form of the wires 2e is set as the form illustrated in FIG. 5 in the foregoing simulation when the number of drain pads 51 is four. The solid line G21 indicates a relationship therebetween in the wire 2e connected to the drain pad 51, of four drain pads 51, positioned on the outer side. The dotted line G22 indicates a relationship therebetween in the wire 2e connected to the drain pad 51, of four drain pads 51, positioned on the inner side. As illustrated in FIG. 13, by forming the wires 2e non-parallel to each other, compared to when they are parallel to each other (FIG. 8), it can be seen that both the solid line G21 and the dotted line G22 move to the lower phase side and become closer to each other. That is, a phase difference is reduced. According to the present embodiment, a mutual inductance occurring in the wires 2e can be reduced, and inductance variation between the wires 2e can be reduced.

As in the present embodiment, the lengths of the wires 2e may be equivalent to each other, and the shapes of the wires 2e connected to adjacent drain pads 51 when viewed in the normal direction of the upper surfaces 5a and 9a may be line-symmetrical with the axis Q perpendicular to both the direction D1 and the normal direction. In this case, since variation in angle formed by the adjacent wires 2e is curbed, inductance variation between the wires 2e can be reduced more effectively.

As in the present embodiment, the semiconductor device 1 may further include the output circuit substrate 9 having the metal pattern 92. The metal pattern 92 is connected to at least two drain pads 51 via the output wires 2e. A gap between adjacent output wires 2e connecting the metal pattern 92 to at least two drain pads 51 is smaller on the metal pattern 92 side than on the drain pads 51 side. For example, due to such a configuration, the adjacent wires 2e can be easily made non-parallel to each other. Furthermore, as compared with the case where the wires 2e are parallel to each other, the one ends of the wires 2e become closer to each other. Therefore, even when the connection position between the wire 2f and the metal pattern 92 deviates from the center of the metal pattern 92 (refer to FIG. 11), the variation in the length of the current path J can be reduced, and the phase difference of the signals from the two drain pads 51 can be reduced.

As in the present embodiment, when viewed in the normal direction of the upper surfaces 5a and 9a, the angle θ formed by the wires 2e extending from the two drain pads 51 may be 45° or more and 55° or less. According to simulation results which will be described below, inductance variation between the wires 2e can be reduced more effectively in this case.

As in the present embodiment, the semiconductor device 1 may include the input circuit substrates 8 that has the metal patterns 82. Each of the metal patterns 82 may be connected to at least two of the gate pads 50 via the wires 2d. This makes it possible for the input circuit substrates 8 to perform impedance matching for the input signals input to the gate pads 50 of the transistors 5.

As in the present embodiment, the semiconductor device 1 may include the input circuit substrates 8, the base 31, the frame 32, the input terminal 34, and the output terminal 35. The input circuit substrates 8 may have the metal patterns 82. The base 31 may have the transistors 5, the input circuit substrates 8, and the output circuit substrates 9 mounted thereon. The frame 32 may be provided on the base 31 and surround the transistors 5, the input circuit substrates 8, and the output circuit substrates 9. The input terminal 34 may be provided on the frame 32 and be connected to the input circuit substrates 8. The output terminal 35 may be provided on the frame 32 and be connected to the output circuit substrates 9. Each of the metal patterns 82 may be connected to at least two of the gate pads 50 via the wires 2d. Thus, the semiconductor device 1 can constitute a radio frequency device.

As in the present embodiment, the semiconductor device 1 may have the plurality of transistors 5, the plurality of input circuit substrates 8, and the plurality of output circuit substrates 9. Thus, the plurality of transistors 5 can be provided, and the semiconductor device 1 can constitute a high-output radio frequency device.

As in the present embodiment, the semiconductor device 1 may include the input branching circuit substrates 6 and 7 and the output coupling circuit substrates 10 and 11. The input branching circuit substrates 6 and 7 may have the branching patterns 63 and 73 whose one end is connected to the input terminal 34 and the other end is connected to the input circuit substrates 8. The output coupling circuit substrates 10 and 11 may have the coupling patterns 103 and 113 whose one end is connected to the output circuit substrates 9 and the other end is connected to the output terminal 35. The input branching circuit substrates 6 and 7 can distribute the input signal to signals of the same level. The output coupling circuit substrates 10 and 11 can couple signals and output a high output signal.

As in the present embodiment, the semiconductor device 1 may include the base 31 that has the transistors 5 and the output circuit substrates 9 mounted thereon. Each output circuit substrate 9 may have the dielectric substrate 91. The metal patterns 92 may be provided on the upper surface of the dielectric substrate 91. The rear surface of the dielectric substrate 91 may be connected to the base 31. Each output circuit substrate 9 may have the capacitance components between the metal patterns 92 and the base 31. Since the output circuit substrate 9 has the capacitance components, impedance matching for the output signals output from the drain pads 51 of the transistor 5 can be performed. By using the dielectric substrates 91 for the output circuit substrates 9, the output circuit substrates 9 can be miniaturized.

As in the present embodiment, the semiconductor device 1 may include the base 31 that has the transistors 5 and the input circuit substrates 8 mounted thereon. Each input circuit substrate 8 may have the dielectric substrate 81. The metal patterns 82 may be provided on the upper surface of the dielectric substrate 81. The rear surface of the dielectric substrate 81 may be connected to the base 31. Each input circuit substrate 8 may have the capacitance components between the metal patterns 82 and the base 31. Since the input circuit substrate 8 has the capacitance components, impedance matching for the input signals input to the gate pads 50 of the transistor 5 can be performed. By using the dielectric substrates 81 for the input circuit substrates 8, the input circuit substrates 8 can be miniaturized.

As in the present embodiment, the input branching circuit substrates 6 and 7 may have dielectric substrates 61 and 71, respectively. The branching patterns 63 and 73 may be provided on the upper surfaces of the dielectric substrates 61 and 71, respectively. The rear surfaces of the dielectric substrates 61 and 71 may be connected to the base 31. The input branching circuit substrate 6 may have the capacitance component between the branching pattern 63 and the base 31. The input branching circuit substrate 7 may have the capacitance component between the branching pattern 73 and the base 31. Since the input branching circuit substrates 6 and 7 have the capacitance components, impedance matching for the input signals input to the gate pads 50 of the transistors 5 can be performed. By using the dielectric substrates 61 and 71 for the input branching circuit substrates 6 and 7, the input branching circuit substrates 6 and 7 can be miniaturized.

As in the present embodiment, the output coupling circuit substrates 10 and 11 may have dielectric substrates 101 and 111, respectively. The coupling patterns 103 and 113 may be provided on the upper surfaces of the dielectric substrate 101 and 111, respectively. The rear surfaces of the dielectric substrates 101 and 111 may be connected to the base 31. The output coupling circuit substrate 10 may have the capacitance components between the coupling patterns 103 and the base 31. The output coupling circuit substrate 11 may have the capacitance components between the coupling pattern 113 and the base 31. Since the output coupling circuit substrates 10 and 11 have the capacitance components, impedance matching for the output signals output from the drain pads 51 of the transistors 5 can be performed. By using the dielectric substrates 101 and 111 for the output coupling circuit substrates 10 and 11, the output coupling circuit substrates 10 and 11 can be miniaturized.

Figure 14:
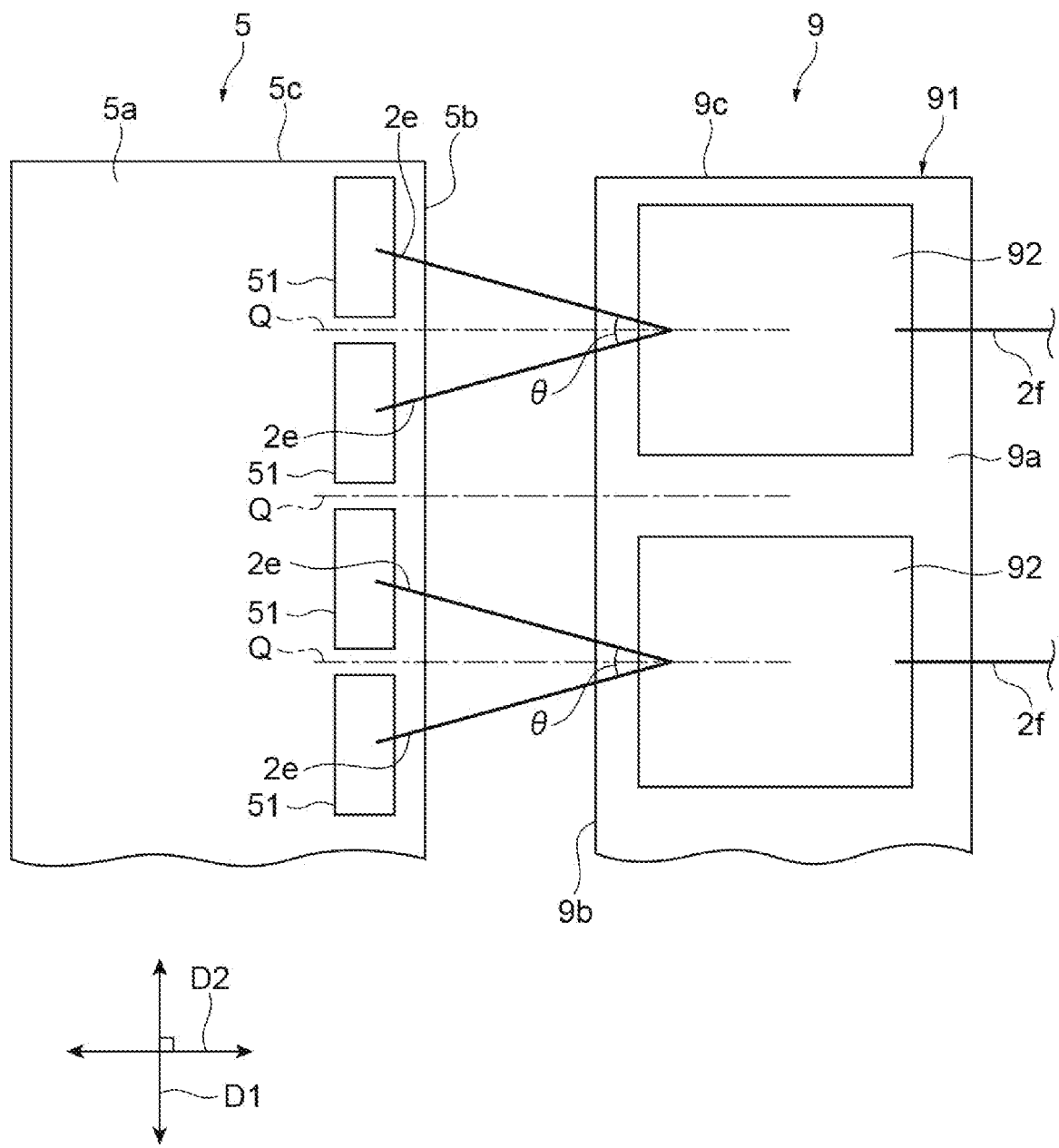
FIG. 14 is an enlarged plan view according to a modification and illustrates a part of each of an output matching circuit substrate and the transistor.

Modification FIG. 14 is an enlarged plan view according to a modification of the foregoing embodiment and illustrates a part of each of the output circuit substrate 9 and the transistor 5. As illustrated in FIG. 14, also in the present modification, when viewed in the normal direction of each of the upper surfaces 5a and 9a, adjacent wires 2e are non-parallel to each other. In the foregoing embodiment, on each metal pattern 92, one ends of the wires 2e extending from two drain pads 51 are separated from each other with the gap Wa therebetween (refer to FIG. 5). In the present modification, these one ends are in contact with each other at the connection point connected to each metal pattern 92. Here, one ends in contact with each other include three forms as follows. In the first form, one wire 2e and the other wire 2e are continuous with each other at one ends thereof. In the second form, one end of one wire 2e and one end of the other wire 2e are arranged in the direction D1 and in contact with each other. In the third form, one end of one wire 2e and one end of the other wire 2e overlap each other.

As an example, the shapes of the wires 2e connected to adjacent drain pads 51 viewed in the normal direction of the upper surfaces 5a and 9a (in other words, the shapes projected in the D1-D2 plane) is line-symmetrical with the axis Q perpendicular to both the direction D1 and the normal direction of the upper surfaces 5a and 9a. Also in the present modification, when viewed in the normal direction of the upper surfaces 5a and 9a, the angle θ formed by the wires 2e extending from two drain pads 51 is 20° or more and 145° or less, for example, and is more preferably 45° or more and 55° or less.

Figure 15:
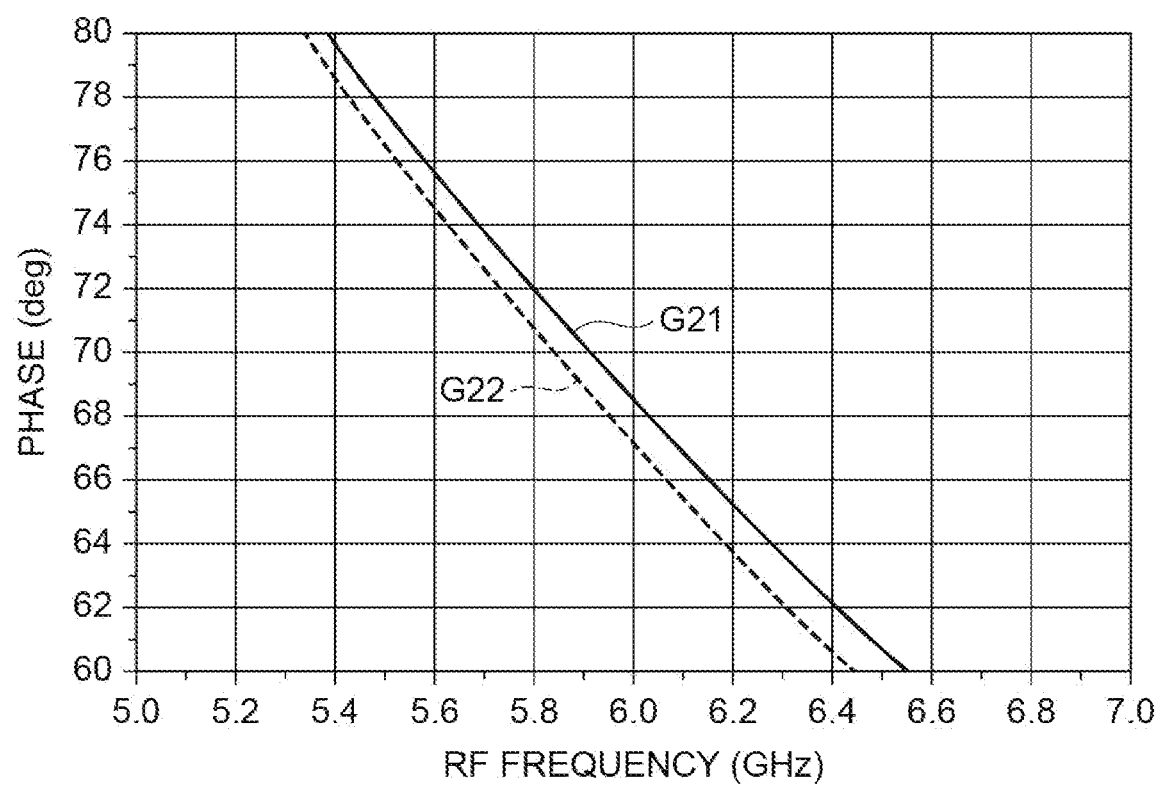
FIG. 15 is a graph illustrating a relationship between a signal frequency and a phase when the form of the output wires is set as the form illustrated in FIG. 14 in the simulation when the transistor has four output pads.

FIG. 15 is a graph illustrating a relationship between a signal frequency (unit: GHz) and a phase (unit: degree) when the form of the wires 2e is set as the form illustrated in FIG. 14 in the simulation (when the number of drain pads 51 is four) which has been described in the foregoing embodiment. The solid line G21 indicates a relationship therebetween in the wire 2e connected to the drain pad 51, of four drain pads 51, positioned on the outer side. The dotted line G22 indicates a relationship therebetween in the wire 2e connected to the drain pad 51, of four drain pads 51, positioned on the inner side. As illustrated in FIG. 15, also in the present modification, both the solid line G21 and the dotted line G22 move to the lower phase side and become closer to each other. That is, a phase difference is reduced. According to the present modification, a mutual inductance occurring in the wires 2e can be reduced, and inductance variation between the wires 2e can be reduced.

Figure 16:
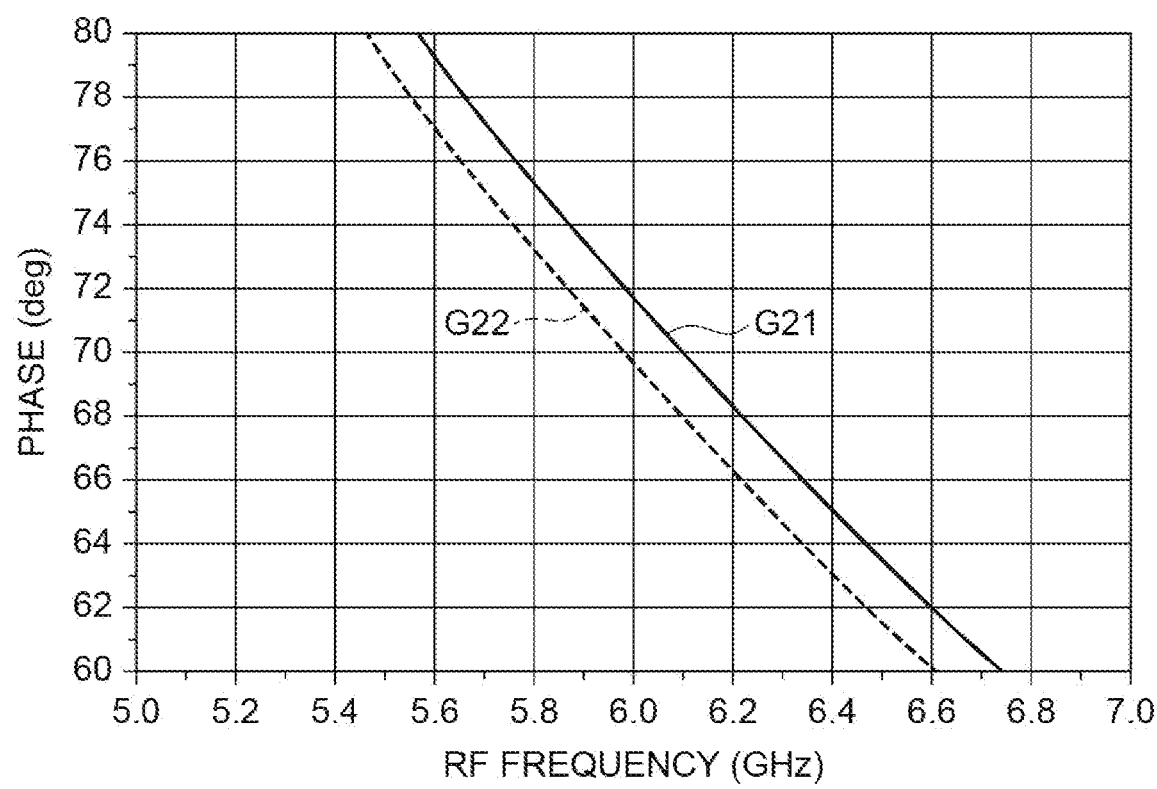
FIG. 16 is a graph illustrating a signal phase when the connection position between the wire and the metal pattern deviates from the center of the metal pattern in the simulation when the transistor has four output pads.

As in the present modification, on each metal pattern 92, one ends of the wires 2e extending from two drain pads 51 may be in contact with each other at the connection point connected to the metal pattern 92. For example, due to such a configuration, the wires 2e can be easily made non-parallel to each other. Furthermore, since one ends of the wires 2e extending from two drain pads 51 are provided substantially at the same position, it is possible to almost eliminate variation in length of the current path J in the case in which the connection position between the wire 2f and the metal pattern 92 deviates from the center of the metal pattern 92 (refer to FIG. 11). Therefore, a phase difference between signals from two drain pads 51 can be curbed more effectively. FIG. 16 is a graph illustrating a signal phase when the connection position between the wire 2f and the metal pattern 92 deviates from the center of the metal pattern 92 in the foregoing simulation when the number of drain pads 51 is four. As illustrated in FIG. 16, the phase difference between the signal phase on a side where the current path J is shortened due to the positional deviation of the wire 2f (solid line G21) and the signal phase on a side where the current path J is lengthened due to the positional deviation of the wire 2f (dotted line G22) is noticeably reduced compared to that in FIG. 12.

Figure 17:
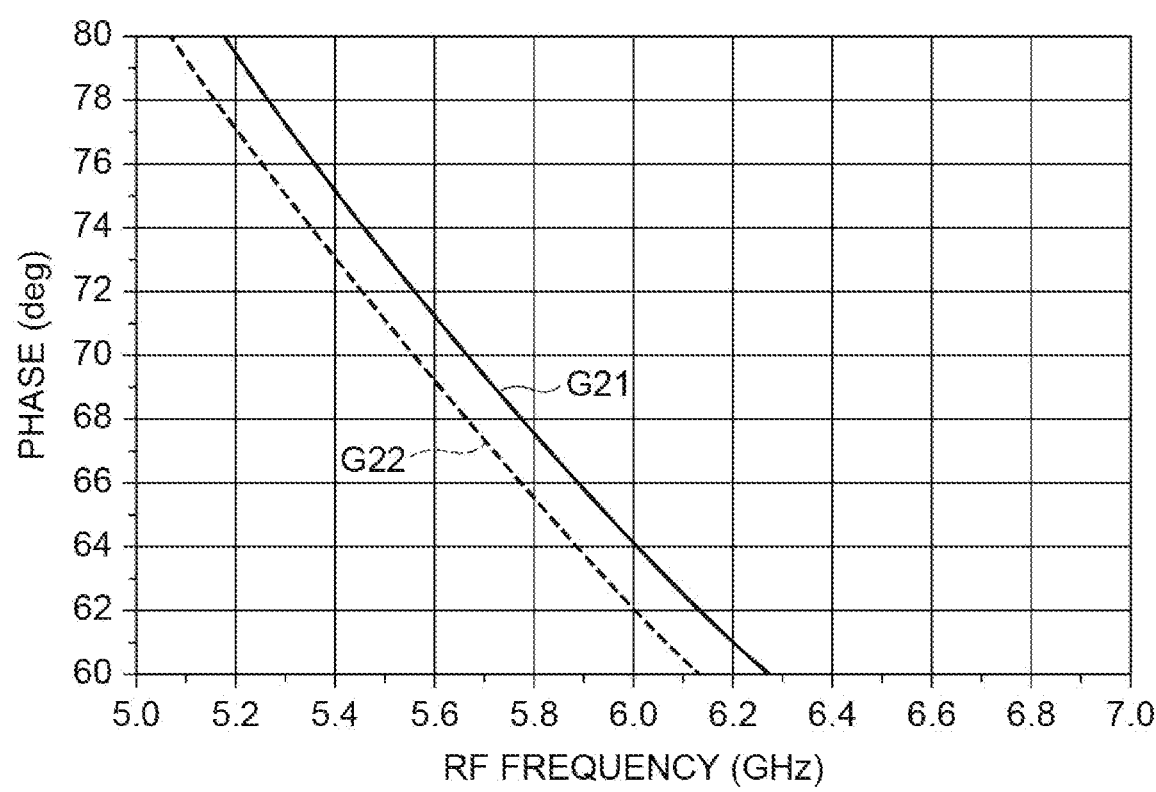
FIG. 17 is a graph illustrating a relationship between a signal frequency and a phase when an angle $\theta$ is 30° in the modification.
Figure 18:
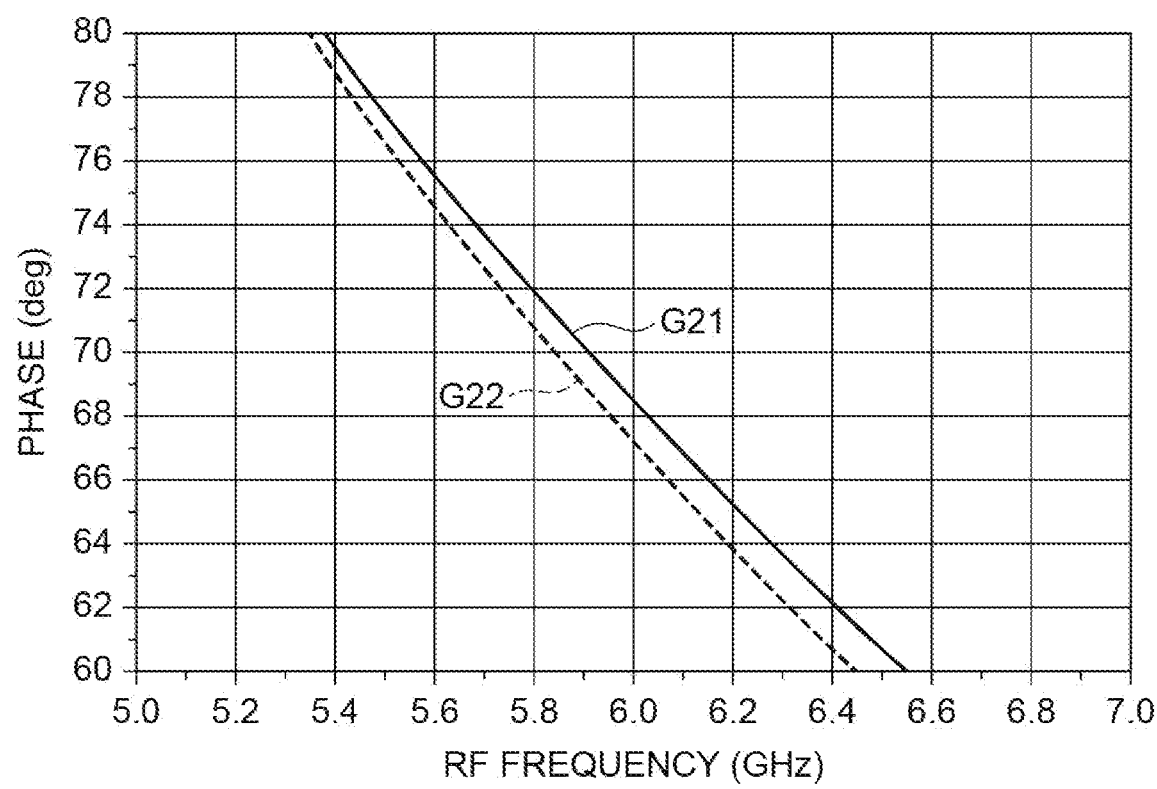
FIG. 18 is a graph illustrating a relationship between a signal frequency and a phase when the angle $\theta$ is 50° in the modification.
Figure 19:
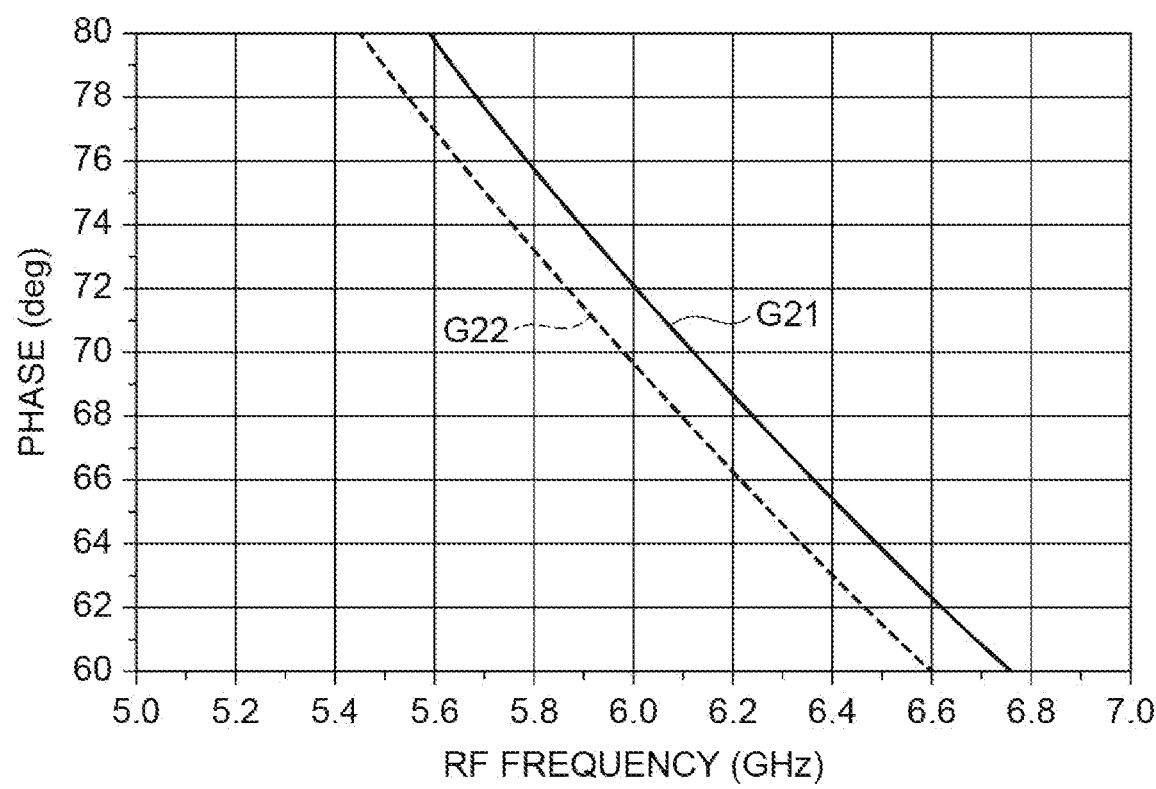
FIG. 19 is a graph illustrating a relationship between a signal frequency and a phase when the angle $\theta$ is 60° in the modification.
Figure 20:
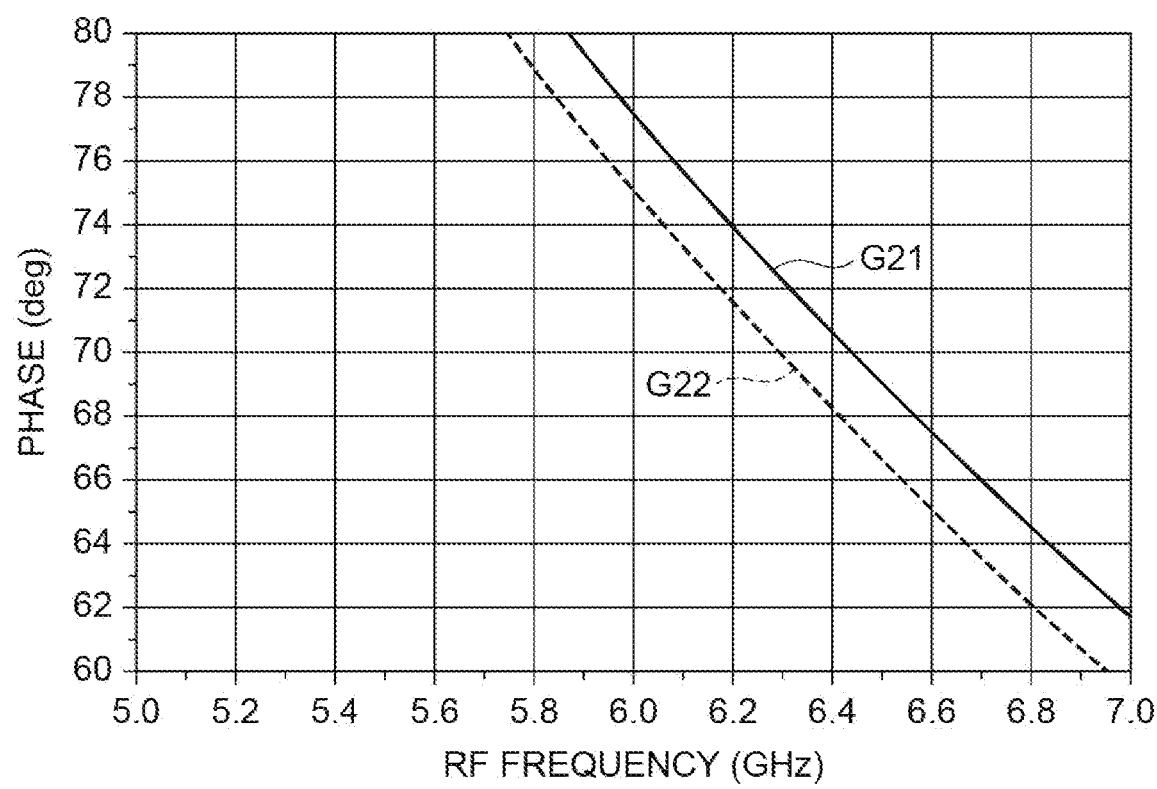
FIG. 20 is a graph illustrating a relationship between a signal frequency and a phase when the angle $\theta$ is 90° in the modification.

A suitable size of the angle θ formed by the wires 2e extending from two drain pads 51 will be reviewed. FIGS. 17 to 20 are graphs illustrating a relationship between a signal frequency and a phase when the angle θ is changed in the present modification. FIG. 17 illustrates a case of θ=30°. FIG. 18 illustrates a case of θ=50°. FIG. 19 illustrates a case of θ=60°. FIG. 20 illustrates a case of θ=90°. When these graphs are compared to each other, it can be seen that the gap (that is, the phase difference) between the solid line G21 and the dotted line G22 becomes the smallest when θ=50°. That is, an optimum value for the angle θ is 50°. Practically, the angle θ may be in the vicinity of 50° (for example, within a range of 50°±5°). It is also considered to be the same in the foregoing embodiment, that is, in the case where one ends of the wires 2e extending from two drain pads 51 are separated from each other.

The semiconductor device according to the present disclosure is not limited to the embodiment described above, and various other modifications can be made. For example, in the foregoing embodiment, the present disclosure is applied to the semiconductor device 1 including the transistors 5, the input branching circuit substrates 6 and 7, the input circuit substrates 8, the output circuit substrates 9, and the output coupling circuit substrates 10 and 11. The present disclosure is not limited thereto and can be applied to a semiconductor device including a transistor and a circuit substrate disposed side by side with the transistor.

What is claimed is:

1. A semiconductor device comprising:
at least one transistor having a plurality of input pads arranged along one side of the at least one transistor and a plurality of output pads arranged along another side of the at least one transistor, the another side facing the one side;
a plurality of input wires respectively connected to the plurality of input pads;
a plurality of output wires respectively connected to the plurality of output pads and having longer wire lengths than the plurality of input wires; and
at least one output circuit substrate having first metal patterns,
wherein adjacent input wires of the plurality of input wires are arranged parallel to each other, and adjacent output wires of the plurality of output wires are arranged non-parallel to each other,
wherein each of the first metal patterns is connected to at least two output pads of the plurality of output pads via the adjacent output wires, and
wherein a gap between the adjacent output wires connecting one of the first metal patterns to the at least two output pads is smaller on the first metal patterns side than on the output pads side.

2. The semiconductor device according to claim 1, wherein ends of the adjacent output wires extending from the at least two output pads are in contact with each other at a connection point connected to the one of the first metal patterns.

3. The semiconductor device according to claim 1, wherein an angle formed by the adjacent output wires extending from the at least two output pads is 45° or more and 55° or less.

4. The semiconductor device according to claim 1 further comprising:
at least one input circuit substrate having second metal patterns, each of the second metal patterns being connected to at least two input pads of the plurality of input pads via the adjacent input wires;
a base configured to have the at least one transistor, the at least one input circuit substrate, and the at least one output circuit substrate mounted thereon;
a frame provided on the base and surrounding the at least one transistor, the at least one input circuit substrate, and the at least one output circuit substrate;
an input terminal provided on the frame and connected to the at least one input circuit substrate; and
an output terminal provided on the frame and connected to the at least one output circuit substrate.

5. The semiconductor device according to claim 1, further comprising a base configured to have the at least one transistor and the at least one output circuit substrate mounted thereon,
wherein the at least one output circuit substrate has a dielectric substrate, the first metal patterns are provided on an upper surface of the dielectric substrate, a rear surface of the dielectric substrate is connected to the base, and the at least one output circuit substrate has capacitance components between the first metal patterns and the base.

6. The semiconductor device according to claim 1, wherein the plurality of output pads are a plurality of drain pads.

7. The semiconductor device according to claim 1, wherein the plurality of input pads are a plurality of gate pads.

8. The semiconductor device according to claim 1, wherein a semiconductor part of the at least one transistor is made of a gallium-nitride-based semiconductor.

9. The semiconductor device according to claim 4, wherein
the at least one transistor comprises a plurality of transistors,
the at least one input circuit substrate comprises a plurality of input circuit substrates, and
the at least one output circuit substrate comprises a plurality of output circuit substrates.

10. The semiconductor device according to claim 9, further comprising:
an input branching circuit substrate having a branching pattern whose one end is connected to the input terminal and the other end is connected to the plurality of input circuit substrates; and
an output coupling circuit substrate having a coupling pattern whose one end is connected to the plurality of output circuit substrates and the other end is connected to the output terminal.

11. The semiconductor device according to claim 10, wherein the input branching circuit substrate has a dielectric substrate, the branching pattern is provided on an upper surface of the dielectric substrate, a rear surface of the dielectric substrate is connected to the base, and the input branching circuit substrate has a capacitance component between the branching pattern and the base.

12. The semiconductor device according to claim 10, wherein the output coupling circuit substrate has a dielectric substrate, the coupling pattern is provided on an upper surface of the dielectric substrate, a rear surface of the dielectric substrate is connected to the base, and the output coupling circuit substrate has a capacitance component between the coupling pattern and the base.

13. A semiconductor device comprising:
at least one transistor having a plurality of input pads arranged along one side of the at least one transistor and a plurality of output pads arranged along another side of the at least one transistor, the another side facing the one side;
a plurality of input wires respectively connected to the plurality of input pads;
a plurality of output wires respectively connected to the plurality of output pads and having longer wire lengths than the plurality of input wires; and
at least one input circuit substrate having metal patterns, each of the metal patterns being connected to at least two input pads of the plurality of input pads via adjacent input wires of the plurality of input wires, wherein the adjacent input wires of the plurality of input wires are arranged parallel to each other, and adjacent output wires of the plurality of output wires are arranged non-parallel to each other.

14. The semiconductor device according to claim 13, further comprising a base configured to have the at least one transistor and the at least one input circuit substrate mounted thereon, wherein the at least one input circuit substrate has a dielectric substrate, the metal patterns are provided on an upper surface of the dielectric substrate, a rear surface of the dielectric substrate is connected to the base, and the at least one input circuit substrate has capacitance components between the metal patterns and the base.

15. The semiconductor device according to claim 13, wherein the plurality of output pads are a plurality of drain pads.

16. The semiconductor device according to claim 13, wherein the plurality of input pads are a plurality of gate pads.

17. The semiconductor device according to claim 13, wherein a semiconductor part of the at least one transistor is made of a gallium-nitride-based semiconductor.

* * * * *